(12) United States Patent
Green et al.

(10) Patent No.: US 10,825,924 B2
(45) Date of Patent: Nov. 3, 2020

(54) SEMICONDUCTOR DEVICE WITH SELECTIVELY ETCHED SURFACE PASSIVATION

(71) Applicant: NXP USA, Inc., Austin, TX (US)

(72) Inventors: Bruce M. Green, Gilbert, AZ (US); Darrell G. Hill, Chandler, AZ (US); Karen E. Moore, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/652,146

(22) Filed: Jul. 17, 2017

(65) Prior Publication Data

US 2017/0317202 A1 Nov. 2, 2017

Related U.S. Application Data

(60) Continuation-in-part of application No. 14/827,755, filed on Aug. 17, 2015, now Pat. No. 9,799,760, (Continued)

(51) Int. Cl.
*H01L 29/778* (2006.01)
*H01L 21/311* (2006.01)
(Continued)

(52) U.S. Cl.
CPC ...... *H01L 29/778* (2013.01); *H01L 21/28575* (2013.01); *H01L 21/31111* (2013.01); *H01L 21/31116* (2013.01); *H01L 23/3171* (2013.01); *H01L 29/0615* (2013.01); *H01L 29/1029* (2013.01); *H01L 29/2003* (2013.01); *H01L 29/205* (2013.01); *H01L 29/402* (2013.01); (Continued)

(58) Field of Classification Search
CPC ......... H01L 29/42316; H01L 29/66431; H01L 29/778; H01L 29/802; H01L 29/432; H01L 29/205; H01L 29/0615; H01L 29/7787; H01L 29/66462; H01L 29/402; H01L 29/2003; H01L 29/1029; H01L 29/812; H01L 21/31116; H01L 21/28575
See application file for complete search history.

(56) References Cited

U.S. PATENT DOCUMENTS 5,286,985 A 2/1994 Taddiken
6,529,034 B1 3/2003 Ranjan
(Continued)

OTHER PUBLICATIONS

Chen et al., "Fabrication of Enhancement-Mode AlaN/GaN MISHEMTs by Using Fluorinated Al2O3 as Gate Dielectrics", IEEE Elect Dev. Lett., Oct. 2011, pp. 1373-1375, vol. 32, No. 10.
(Continued)

*Primary Examiner* — Thanh Y. Tran
(74) *Attorney, Agent, or Firm* — Bruce M. Green

(57) ABSTRACT

A semiconductor device includes a semiconductor substrate configured to include a channel, a gate supported by the semiconductor substrate to control current flow through the channel, a first dielectric layer supported by the semiconductor substrate and including an opening in which the gate is disposed, and a second dielectric layer disposed between the first dielectric layer and a surface of the semiconductor substrate in a first area over the channel. The gate may be configured to include a lateral overhang that is separated from an upper surface of the first dielectric layer.

20 Claims, 14 Drawing Sheets

Related U.S. Application Data which is a division of application No. 13/533,651, filed on Jun. 26, 2012, now Pat. No. 9,111,868.

(51) Int. Cl.

| | | |
|---|---|---|
| *H01L 21/285* | (2006.01) | |
| *H01L 29/20* | (2006.01) | |
| *H01L 29/10* | (2006.01) | |
| *H01L 29/66* | (2006.01) | |
| *H01L 29/40* | (2006.01) | |
| *H01L 29/205* | (2006.01) | |
| *H01L 29/06* | (2006.01) | |
| *H01L 23/31* | (2006.01) | |
| *H01L 29/812* | (2006.01) | |
| *H01L 29/51* | (2006.01) | |

(52) U.S. Cl.
CPC .... *H01L 29/66462* (2013.01); *H01L 29/7787* (2013.01); *H01L 29/517* (2013.01); *H01L 29/812* (2013.01)

(56) References Cited

U.S. PATENT DOCUMENTS

| | | | |
|---|---|---|---|
| 7,875,537 | B2 | 1/2011 | Suvorov et al. |
| 7,972,915 | B2 | 7/2011 | Chen et al. |
| 8,035,111 | B2 | 10/2011 | Sheppard |
| 8,076,699 | B2 | 12/2011 | Chen et al. |
| 8,728,884 | B1 | 5/2014 | Hussain et al. |
| 8,823,057 | B2 | 9/2014 | Sheppard et al. |
| 8,946,776 | B2 | 2/2015 | Green et al. |
| 9,029,986 | B2 | 5/2015 | Green et al. |
| 9,111,868 | B2 | 8/2015 | Green et al. |
| 9,337,332 | B2 | 5/2016 | Chu et al. |
| 9,799,760 | B2 | 10/2017 | Green et al. |
| 2003/0209811 | A1 | 11/2003 | Holm et al. |
| 2006/0197193 | A1 | 9/2006 | Gu et al. |
| 2007/0018199 | A1 | 1/2007 | Sheppard et al. |
| 2007/0164322 | A1* | 7/2007 | Smith .......... H01L 29/42312 257/256 |
| 2007/0241419 | A1 | 10/2007 | Green et al. |
| 2008/0128752 | A1* | 6/2008 | Wu ............... H01L 29/402 257/194 |
| 2009/0020823 | A1 | 1/2009 | Fujita |
| 2009/0146191 | A1 | 6/2009 | Green et al. |
| 2009/0159930 | A1* | 6/2009 | Smorchkova ..... H01L 29/42316 257/194 |
| 2009/0230432 | A1 | 9/2009 | Miyashita |
| 2010/0120237 | A1 | 5/2010 | Tanaka et al. |
| 2011/0049526 | A1 | 3/2011 | Chu et al. |
| 2011/0057232 | A1 | 3/2011 | Sheppard et al. |
| 2011/0136305 | A1 | 6/2011 | Saxler et al. |
| 2012/0153301 | A1 | 6/2012 | Shealy et al. |
| 2012/0156836 | A1 | 6/2012 | Shealy et al. |
| 2012/0156843 | A1 | 6/2012 | Green et al. |
| 2012/0292663 | A1 | 11/2012 | Lin et al. |
| 2012/0319169 | A1 | 12/2012 | Van Hove |
| 2013/0009165 | A1 | 1/2013 | Park et al. |
| 2013/0015460 | A1 | 1/2013 | Chen et al. |
| 2013/0092947 | A1 | 4/2013 | Green et al. |
| 2013/0146893 | A1 | 6/2013 | Thei et al. |
| 2013/0168685 | A1 | 7/2013 | Hsu et al. |
| 2013/0277680 | A1 | 10/2013 | Green et al. |
| 2013/0341679 | A1 | 12/2013 | Green et al. |
| 2014/0077266 | A1 | 3/2014 | Ramdani et al. |
| 2015/0013715 | A1 | 1/2015 | Ueda et al. |
| 2015/0357452 | A1 | 12/2015 | Green et al. |

OTHER PUBLICATIONS

Dong Seup Lee et al., "300-GHz InAlN/GaN HEMTs with InGaN Back Barrier", IEEE Electronc Device Letters, Nov. 2011, pp. 1525-1527, vol. 32, No. 11.

Liu et al., "Improved Linearity for Low-Noise Applications in 0.25-μm GaN MISHEMTs Using ALO Al2O3 as Gate Dielectric", Elect. Dev. Lett., Aug. 2010, pp. 803-805, vol. 31, No. 8.

Marleen Van Hove et al., "CMOS Process-Compatible High-Power Low-Leakage AlGaN/GaN MISHEMT on Silicon", IEEE Electron Device Letters, May 2012, pp. 667-669, vol. 33, No. 5.

"Seshadri Kolluri et al., ""N-Polar AlGaN/GaN Mis-HEMTs on SiC with a 16.7 W/mm Power Density at 10 GHzUsing an Al2O3 Based Eich Stop Technology for the Gate Recess""", IEEE conference publication, 69th Annual Device Research Conference, 2011, pp. 215-216".

Stephan Maroldt, "Gallium Nitride Based Transistors for High-Efficiency Microwave Switch-Mode Amplifiers", Ph. D Dissertation, Albert Ludwigs University, Jun. 2010, 10 pages, Freiburg, Germany.

Toshihiro Ohki et al., "Reliability of GaN HEMTs: Current Status and Future Technology", IEEE conference publication, 47th Annual International Reliability Physics Symposium, 2009, pp. 61-70.

Vetury et al., "Performance and RF Reliability of GaN-on-SiC HEMT's Using Dual-Gate Architectures", International Microwave Symposium Digest, 2006, pp. 714-717.

Wentzel et al., "RF Class-S Power Amplifiers: State of the Art Results and Potential", 2010 International Microwave Symposium Digest, Jun. 2010, pp. 812-815, Anaheim, CA.

Y. Xuan et al., "Capacitance-Voltage Studies on Enhancement-Mode InGaAs Metal-Oxide-Semiconductor Field-Effect Transistor Using Atomic-Layer-Deposited Al2O3 Gate Dielectric", Purdue University, Applied Physics Letters 88, 263518, Jun. 30, 2006, 4 pages.

Notice of Allowance dated Jun. 21, 2017 for U.S. Appl. No. 14/827,755 9 pages.

Non-Final Office Action dated Jun. 3, 2016 for U.S. Appl. No. 14/827,755 14 pages.

Final Office Action dated Dec. 1, 2016 for U.S. Appl. No. 14/827,755 23 pages.

Notice of Allowance dated Apr. 24, 2015 for U.S. Appl. No. 13/533,651 7 pages.

Non-Final Office Action dated Sep. 22, 2014 for U.S. Appl. No. 13/533,651, 11 pages.

Non-Final Office Action dated May 4, 2018 for U.S. Appl. No. 15/587,276 19 pages.

Notice of Allowance dated May 22, 2019 for U.S. Appl. No. 15/587,276 10 Pages.

Notice of Allowance dated Aug. 22, 2019 for U.S. Appl. No. 15/587,276 11 Pages.

Final Rejection Office Action dated Jan. 7, 2019 for U.S. Appl. No. 15/587,276 24 pages.

Kikkawa, Toshihide; "Highly Reliable 250W GaN High Electron Mobility Transistor Power Amplifier;" Fujitsu Laboratories Ltd., Japanese Journal of Applied Physics. vol. 44, No. 7A, pp. 4896-4901 (2005); Published Jul. 8, 2005.

Recht, Felix et al.; "Nonalloyed Ohmic Contacts in AlGaN/GaN HEMTs by Ion Implantation With Reduced Activation Annealing Temperature;" IEEE Electron Device Letters, Apr. 2006; vol. 27, No. 4, pp. 205-207.

Non-Final Office Action dated Apr. 30, 2020 for U.S. Appl. No. 16/237,362 21 pages.

* cited by examiner

SEMICONDUCTOR DEVICE WITH SELECTIVELY ETCHED SURFACE PASSIVATION

RELATED APPLICATIONS

This application is a continuation-in-part of U.S. patent application Ser. No. 14/827,755, filed on Aug. 17, 2015, entitled "Semiconductor Device with Selectively Etched Surface Passivation," which is a divisional of U.S. patent application Ser. No. 13/533,651 filed on Jun. 26, 2012, entitled "Semiconductor Device with Selectively Etched Surface Passivation," and now issued as U.S. Pat. No. 9,111,868, both of which are incorporated herein by reference in their entirety.

TECHNICAL FIELD

The present embodiments relate to semiconductor devices.

BACKGROUND

Gallium nitride (GaN) high electron mobility transistor (HEMT) devices have high breakdown voltages and high cutoff frequencies. Such devices are accordingly useful in high power and high efficiency amplifiers and other devices for high frequency communications and other high frequency applications. HEMT devices are also known as heterojunction field effect transistor (HFET) devices in reference to the derivation of a transistor from a heterostructure.

Aluminum gallium nitride (AlGaN)/GaN heterostructures are capable of high speed switching and present high breakdown voltages because of the high breakdown field strength of GaN and the high electron sheet density of the AlGaN/GaN heterojunction. The high breakdown field strength and high electron sheet density arise from the wide 3.4 eV bandgap of GaN. This bandgap is much wider than the bandgap of other semiconductor materials, such as Si (1 eV bandgap) and GaAs (1.6 eV bandgap). Such GaN heterostructures are accordingly often used in devices calling for highly efficient operation.

GaN HEMT devices have suffered from leakage current and trap-related phenomena, such as current collapse and quiescent current drift. GaN HEMT devices may degrade upon the formation of defects in an AlGaN barrier layer of the device. The defects provide a leakage path for electrons and effectively lower the Schottky barrier height of the gate. Current collapse is a frequency dispersion phenomenon, and may result from surface and buffer traps.

Field plates have been used to reduce the electric field at the gate edge. The reduction in the electric field in that region may address issues of device degradation and current collapse. GaN caps have also been used to reduce the electric field at the gate edge and improve surface morphology. Silicon nitride films have also been used to decrease the influence of surface traps in the interest of addressing current slump. Despite these efforts, gate leakage remains a problem for AlGaN/GaN HFET devices with Schottky gates.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION

Figure 1:
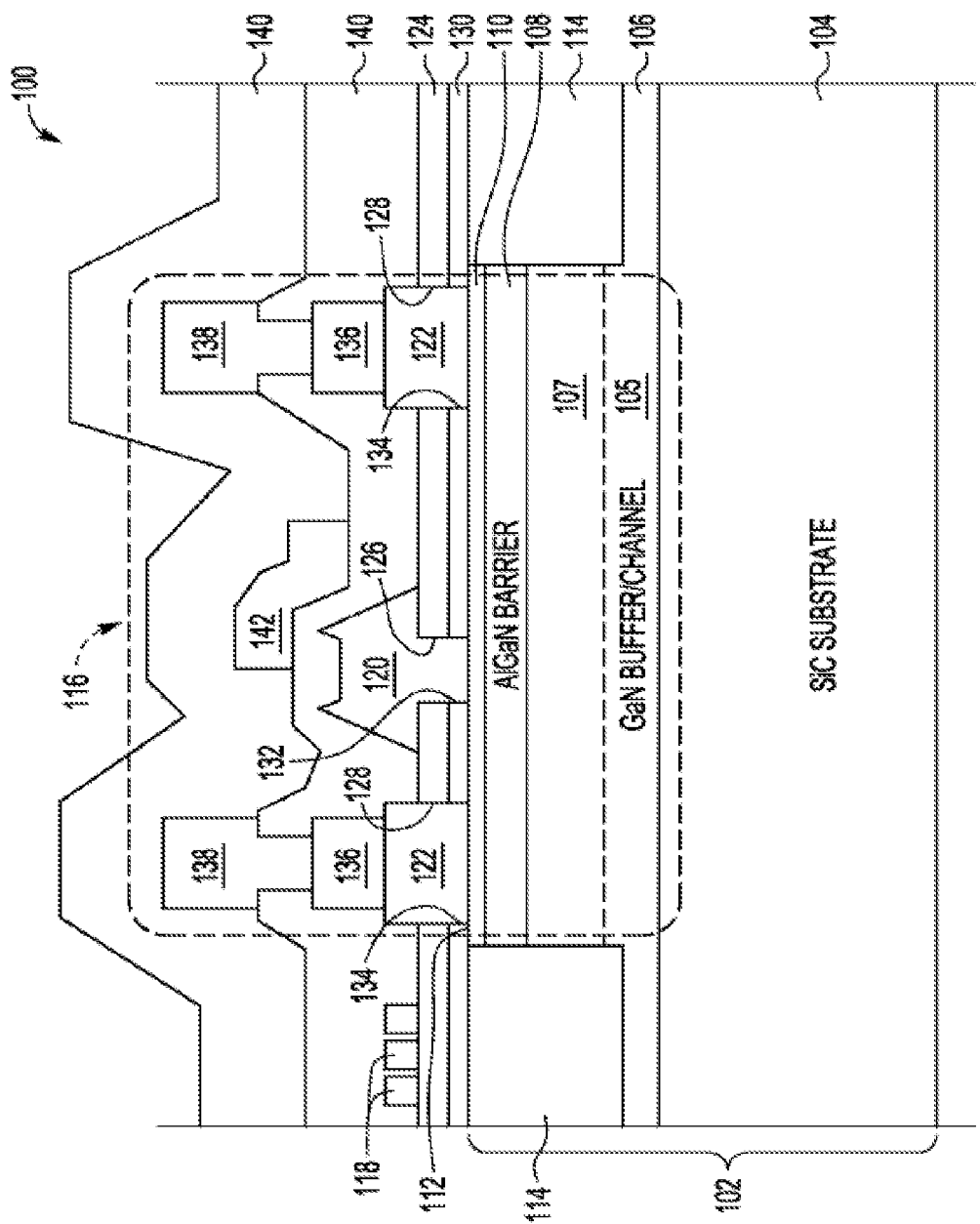
FIG. 1 is a schematic, cross-sectional view of a semiconductor device having selectively etched surface passivation layers in accordance with one embodiment.

GaN transistor devices with selectively etched surface passivation are described. The selective etching addresses damage that may otherwise occur due to reactive ion etch (ME), inductively coupled plasma (ICP), or other dry etch procedures used in connection with gate and ohmic contact formation. Gate leakage and inconsistent ohmic contact resistance that may otherwise arise from such damage may thus be reduced. To avoid or address such problems, the disclosed devices include multiple dielectric layers for surface passivation. The multiple dielectric layers may be selectively etched in connection with the gate and/or the ohmic contacts. The surface damage may thus be avoided while still allowing the surface to be passivated in some portions of the device active area by a desired dielectric material, such as silicon nitride ($Si_3N_4$). For these and other reasons, the disclosed devices may have consistently lower gate leakage and ohmic contact resistances.

The selective etching of the surface passivation may include or involve different etch processing of the dielectric layers to define gate and ohmic contact areas. One dielectric layer may be wet etched, and act as an etch stop for the ME procedure used to etch another dielectric layer. Etch damage from such ME procedures may thus be avoided. The absence of etch damage may, in turn, reduce or eliminate gate leakage in Schottky gate HFET devices, such as AlGaN/GaN HFET devices, in which a dielectric material is deposited on the surface at or near the gate area to address current collapse. The absence of etch damage may also improve the consistency of the ohmic contact resistance.

The selective etching of the dielectric layers may alternatively or additionally include or involve the patterning of the dielectric layer configured for use as an RIE etch stop. The surface passivation in the active area may thus vary as described herein. The patterning may be used to localize the coverage of the etch stop dielectric to selected areas, such as the gate and/or ohmic contact areas and areas proximate thereto to ensure complete coverage of the gate and/or ohmic contact areas. The selective coverage of the etch stop layer may allow one or more portions of the active area to be passivated by $Si_3N_4$, the presence of which at the surface may help prevent current collapse. For example, such $Si_3N_4$-based passivation may tend to increase the doping of GaN layers because of nitrogen vacancies at the device surface. In contrast, portions of the active area in contact with or abutting the gate and/or ohmic contact areas may be passivated by the etch stop dielectric so that the etch stop dielectric may be used to protect the gate and ohmic contact areas. Such non-nitride surface passivation in areas near the gate area may be useful to avoid a reaction between $Si_3N_4$ and one or more Schottky metals, such as nickel, which may otherwise form a conductive nickel silicide (NiSi) layer capable of causing leakage at the device surface.

Although described below in connection with AlGaN/GaN HFET devices, the selective etching of the disclosed devices and methods is well suited for use in connection with other devices. For example, the disclosed devices may utilize a wide variety of semiconductor materials, including other types of Group III-nitride semiconductor materials such as those that contain indium (In) (e.g., InAlN and InGaN). The disclosed devices are also not limited to Group III-nitride semiconductors, and may instead include other compound semiconductor materials, such as non-nitride-based compound semiconductors including, but not limited to, gallium arsenide (GaAs), indium phosphide (InP), indium antimonide (InSb), as well as Group II-Group VI semiconductor materials.

The disclosed devices are also not limited to HFET device configurations. For example, one or more aspects of the disclosed devices and methods may be applied in connection with metal-semiconductor FET (MESFET) devices. The disclosed devices are accordingly not limited to device structures having un-doped semiconductor layers.

The disclosed devices are also not limited to device configurations directed to a particular application or a high voltage context, and may be used in contexts other than RF and power switching.

FIG. 1 is a schematic, cross-sectional view of an exemplary epitaxial GaN transistor device 100 having selectively etched surface passivation in accordance with one embodiment. The transistor device 100 is configured as an HFET or HEMT device. The transistor device 100 includes a semiconductor substrate 102 in which a heterojunction structure is formed on a base substrate 104. In this example, the base substrate 104 includes SiC. The base substrate 104 may include alternative or additional materials, such as sapphire, Si, GaN, AlN, diamond, poly-SiC, SiC on insulator, silicon on insulator, and other substantially insulating materials.

The semiconductor substrate 102 includes a number of semiconductor layers supported by the base substrate 104 and configured in a heterostructure arrangement. Each of the semiconductor layers may be a Group III-nitride semiconductor epitaxial layer. In other embodiments, one or more of the semiconductor layers is not epitaxially grown. In this example, a buffer/channel layer 106 is grown on the base substrate 104 and configured as a channel and buffer of the transistor device 100. A bottom or buffer portion 105 of the buffer/channel layer 106 may include undoped (or not intentionally doped) GaN or GaN doped with a p-type dopant such as C or Fe at a level of about $10^{17}$ to about $10^{19}$ cm-3 to render the buffer portion 105 highly resistive. In embodiments in which the bottom portion 105 is doped, the dopants may be intentionally incorporated during the first 0.1 to 1 micron of epitaxial growth. Undoped subsequent material may then be grown, albeit with the possible incorporation of doping due to "memory effects" present during growth. Alternatively, the buffer portion 105 of the buffer/channel layer 106 may include $Al_xGa_{1-x}N$ where the Al mole fraction, X, is between 0.03 and 0.06. The thickness of the buffer portion 105 may be between about 0.2 and 5 about microns. The $Al_xGa_{1-x}N$ may be doped or undoped. An upper or channel portion 107 of the buffer/channel layer 106 may be generally an undoped lower bandgap material relative to a barrier layer 108 (e.g. AlGaN), such as GaN or $In_xGa_{1-x}N$ where X is between 0 and 1. The channel portion 107 may be optimized for optimal electron transport and device speed by minimizing the amount of alloy and impurity scattering by avoiding Al-containing alloys or high levels of dopants. The channel portion 107 may have a thickness of about 0.01 to about 1 microns. The AlGaN barrier layer 108 is disposed on and adjacent to the buffer/channel layer 106, and a GaN cap layer 110 is disposed on and adjacent to the barrier layer 108. The AlGaN barrier layer 108 may have a thickness of about 30 Angstroms to about 400 Angstroms, or thicknesses in the range of about 70 Angstroms to about 250 Angstroms. The cap layer 110 defines a surface 112 of the semiconductor substrate 102, and may have a thickness of about 10 Angstroms to about 50 Angstroms. One or more of the buffer/channel, barrier, and/or cap layers 106, 108, 110 may be doped, un-doped, or unintentionally doped.

The stress-induced polarization resulting from epitaxial growth of the AlGaN and GaN layers develops a two-dimensional electron gas at the interface between the channel and barrier layers 106 and 108. The two-dimensional electron gas provides charge carriers for conduction during operation. The GaN cap layer 110 may provide protection for the channel and barrier layers 106 and 108 during subsequent processing steps and may be configured to lower gate leakage.

Other semiconductor materials may be used in the channel, barrier, and/or cap layers 106, 108, 110. In some cases, other Group III-nitride semiconductor materials are used. Such materials may include other binary, ternary, and quaternary compounds. For example, other materials such as InGaN may be used for the channel layer 106 that have a bandgap less than the bandgap of the barrier layer 108, as well as a higher electron affinity than the barrier layer 108. Also, $In_xAl_{1-x}N$, where X may but need not be selected to achieve a lattice match with the channel portion 107 of the buffer/channel layer 106, may be used for the barrier layer 108. One or more of the channel, barrier, and/or cap layers 106, 108, 110 may be a composite layer.

In other embodiments, additional semiconductor layers may be incorporated into the heterostructure arrangement. For example, buffer, nucleation, and/or transition semiconductor layers may be included in the semiconductor substrate 102. For instance, an AlN interbarrier layer may be used between the barrier layer 108 and the buffer/channel layer 106.

One or more isolation regions 114 are formed in the semiconductor substrate 102 to define an active area 116 along the surface 112 of the semiconductor substrate 102. The isolation regions 114 may be formed via an implantation procedure configured to damage the epitaxial and/or other semiconductor layers of the semiconductor substrate 102. The configuration and/or fabrication of the isolation regions 114 may vary. For example, the isolation regions 114 may be configured as isolation trenches filled with one or more dielectric materials. In alternative embodiments, the active area 116 of the transistor device 100 is defined via a mesa-etched structure supported by the base substrate 104 and configured to define the heterojunction active area. The semiconductor substrate 102 may thus include such mesa-etched and other semiconductor structures. A number of alignment marks 118 may be formed along the surface 112 outside of the active area 116.

The transistor device 100 includes a gate 120 supported by the semiconductor substrate 102 to control current flow through the buffer/channel layer 106 in the active area 116. In this example, the gate 120 is configured as a Schottky gate and is disposed on the cap layer 110. A variety of materials may be used to form the Schottky contact of the gate 120, such as one or more of nickel (Ni), platinum (Pt), nickel silicide (NiSix), copper (Cu), palladium (Pd), chromium (Cr), tungsten (W), or other suitable materials. The gate 120 may be T-shaped, with a vertically oriented stem as shown. In other embodiments, the gate may be recessed stopping in the AlGaN barrier layer or on an AlN interbarrier layer between the AlGaN barrier layer 108 and the buffer/channel layer 106.

The gate 120 is disposed between a pair of ohmic contacts 122 supported by the semiconductor substrate 102 in the active area 116. The ohmic contacts 122 are spaced from one another to define terminals (e.g., source and drain terminals) of the transistor device 100 between which current flows when the channel is formed by a suitable gate control voltage applied to the gate 120. In this example, the ohmic contacts 122 are disposed on the surface 112 of the semiconductor substrate 102 and are thus deposited on the cap layer 110. In other embodiments, the ohmic contacts 122 are formed in recesses in the semiconductor substrate 102, in which case the ohmic contacts may be deposited on, for instance, the barrier layer 108.

The transistor device 100 includes multiple dielectric layers supported by the semiconductor substrate 102 and configured for surface passivation. A first dielectric layer 124 extends across the active area 116 between the ohmic contacts 122. The dielectric layer 124 may extend beyond the active area 116 as shown. The dielectric layer 124 includes an opening 126 in which the gate 120 is disposed to establish the Schottky junction at the surface 112 of the semiconductor substrate 102. The dielectric layer 124 includes further openings 128 in which the ohmic contacts 122 are disposed.

In this example, the dielectric layer 124 includes low pressure chemical vapor deposition (LPCVD) $Si_3N_4$. Alternative or additional dielectric materials may be used in the dielectric layer 124. In some cases, a layer of $Si_3N_4$ may be deposited via a non-LPCVD procedure. Alternatively, $Si_3N_4$ may be deposited using plasma-enhanced chemical vapor deposition (PECVD), sputtering, or atomic layer deposition may be used to form the dielectric layer 124. Other materials such as silicon dioxide ($SiO_2$), silicon oxide (SiO), silicon oxy-nitride (SiON) may be used to form the dielectric layer 124 using a variety of techniques, such as LPCVD, PECVD, sputtering, or atomic layer deposition. The dielectric layer 124 may be formed in a multi-layer stack using a variety of materials and techniques, including, for instance, one or more of those referenced above.

A second dielectric layer 130 is disposed between the dielectric layer 124 and the surface 112 of the semiconductor substrate 102. The first dielectric layer 124 is spaced from the surface 112 by the second dielectric layer 130. The first dielectric layer 124 may be considered an upper or primary passivation layer, and the second dielectric layer 130 may be considered a lower or intermediary passivation layer. In this embodiment, the second dielectric layer 130 extends across the active area 116 to passivate the entire surface 112 in the active area 116, including those portions of the surface 112 over the channel layer 106. The second dielectric layer 130 extends along or covers the surface 112 with the exception of an opening 132 for the gate 120 and openings 134 for the ohmic contacts 122. The gate 120 is disposed in the openings 126 and 132 to establish a Schottky junction at the surface 112 of the semiconductor substrate 102, while each ohmic contact 122 is disposed in a respective pair of the openings 128 and 134.

The second dielectric layer 130 may be configured as an etch stop layer that also acts as a surface passivation layer. In some embodiments, the second dielectric layer 130 includes a wet etchable material having an etch selectivity to a dry etchant of the first dielectric layer 124. For example, the second dielectric layer 130 may include one or more materials with etch selectivity to fluorine- or fluoride-based and/or other RIE processes used to dry etch $Si_3N_4$. Suitable dry etchants include Tetrafluoromethane ($CF_4$), hexafluoroethane ($C_2F_6$), and Sulfur hexafluoride ($SF_6$). Depending on the etch conditions, oxygen and/or argon may be combined with the dry etchants to prevent polymer formation during the dry etch procedure. The second dielectric layer 130 may thus block the dry etchant from reaching the surface 112 of the semiconductor substrate 102 during formation of the openings 126 and 128. In one example, the second dielectric layer 130 may include aluminum oxide ($Al_2O_3$) deposited via an atomic layer deposition (ALD), CVD, or other procedures, some of which may involve temperatures of, e.g., about 200 to about 400° C. The $Al_2O_3$ layer may have a thickness that falls in range from about 3 nm to about 40 nm. In other embodiments, the second dielectric layer 130 may be deposited in-situ after (e.g., immediately after) the semiconductor substrate 102 is complete, but before the semiconductor substrate 102 is exposed to ambient conditions (e.g., outside the deposition chamber). Such deposition may be done using CVD, MBE, or MOCVD. For example, the dielectric layer 130 may include a single amorphous AlN, $HfO_2$, or $Al_2O_3$ layer. The dielectric layer may also include a multi-layer stack in which the $Al_2O_3$ or AlN layer has a SiN or $SiO_2$ layer deposited as a top layer for surface protection during processing. In these embodiments, the deposition temperature may be about 200° C. to about 800° C., however, deposition temperatures for the dielectric layer disposed on or in contact with the semiconductor substrate 102 may be less than 600° C. In one example, if the first dielectric layer 124 is selectively etched via a dry etch procedure, e.g., using fluorine- or fluoride-based plasma etchants, the $Al_2O_3$ in the second dielectric layer 130 stops the etchant at better than 50:1 etch selectivity to $Si_3N_4$.

The second dielectric layer 130 may then be etched to form the openings 132 and 134 using a wet etch procedure configured to avoid damage to the surface 112 of the semiconductor substrate 102. A number of different wet etch processes may be used. In one example, a buffered oxide etch (BOE) procedure is implemented to define the openings 132 and 134. In $Al_2O_3$ embodiments, the second dielectric layer 130 may alternatively be removed using a wet etch procedure involving diluted HF.

Additional or alternative dielectric materials may be incorporated into, or used as, the second dielectric layer 130. The additional or alternative materials may also have an etch selectivity to block an etchant of the first dielectric layer 124. One such additional or alternative dielectric material is hafnium oxide ($HfO_2$). The second dielectric layer 130 may include a mixture of $Al_2O_3$ and $HfO_2$, discrete layers of $Al_2O_3$ and $HfO_2$, or other combination arrangements. The second dielectric layer 130 is not limited to etch resistant materials. For example, the etch stop dielectric layer may include a dielectric stack including a lower or bottom layer of $SiO_2$ and an upper or top layer of $Al_2O_3$ and/or $HfO_2$. The bottom layer may be configured for compatibility with the semiconductor material (e.g., GaN) at the surface 112. The top layer may include SiN to protect the wafer during subsequent processing steps. The resistance to etchants of the material(s) in the second dielectric layer 130 may thus vary.

The second dielectric layer 130 may be configured to provide surface passivation in the active area 116. For example, use of $Al_2O_3$ in the second dielectric layer 130 provides the passivation function due to the high thermal and chemical stabilities of $Al_2O_3$.

In alternative embodiments, one or more additional dielectric layers may be disposed along the surface 112 in the active area 116. Such layer(s) may be disposed between the first and second dielectric layers 124, 130, below the first and second dielectric layers 124, 130 adjacent the surface 116, or above the first and second dielectric layers 124, 130 in contact with and above the first dielectric layer 124.

The selective etching of the first and second dielectric layers 124, 130 allows both the gate 120 and the ohmic contacts 122 to be formed in a manner that avoids damage to the surface 112 of the semiconductor substrate 102. Damage is avoided by following up the dry etching of the first dielectric layer 124 with a wet etch of the second dielectric layer 130. The wet etch of the areas for both the ohmic contacts 122 and the gate 120 may thus provide low ohmic contact resistance and low gate leakage, respectively. The wet etch for the gate area 120 may be omitted in embodiments in which the transistor device has a metal-insulator-semiconductor (MIS) gate configuration as shown and described below in connection with the embodiment depicted in FIG. 10.

The exemplary embodiment shown in FIG. 1 includes a number of other structures to facilitate connections to the gate 120 and the ohmic contacts 122. For instance, the transistor device 100 may include a patterned metal layer 136 for connections to the ohmic contacts 122. In this example, the metal layer 136 is also used to define the gate 120. A second metal layer 138 may then be defined as shown. One or more inter-layer dielectric (ILD) layers 140 may be deposited to isolate the metal layers 136, 138 and/or for device passivation. In this example, the transistor device 100 also includes a field plate 142 deposited between the ILD layers 140 to shield the gate 120 from high voltages applied to one of the ohmic contacts 122 acting as, for instance, a drain terminal of the transistor device 100.

The embodiments depicted in FIGS. 2-5 show how the etch stop layer, e.g., the second dielectric layer 130, may be patterned in further selective etching of the surface passivation layers. With such patterning, the area(s) in which surface passivation is achieved via the etch stop layer may be localized. For example, the etch stop layer may be limited to areas or portions of the active area in the vicinity of the openings for the gate and/or ohmic contacts. Other portions of the active area may thus be covered and passivated by the other dielectric layer (e.g., a $Si_3N_4$ layer). Such patterning may retain one or more of the advantages of the wet-etched dielectric layer (e.g., $Al_2O_3$) while allowing for the benefits of other surface passivation layers in areas spaced from gate and/or ohmic contact areas. For example, allowing $Si_3N_4$ to passivate the surface of the semiconductor substrate may be useful in embodiments having a Group III-nitride semiconductor material such as GaN defining the surface. The presence of LPCVD $Si_3N_4$ at the surface tends to dope the surface n-type from, e.g., nitrogen vacancies due to the sublimation of GaN, which may occur at temperatures around 675° C. Such extra n-type doping reduces the onset of current collapse in the device. Further details regarding the use of surface passivation of GaN-based transistor devices is set forth in U.S. Patent Publication No. 2007/0241419 ("Transistor and Method with Dual Layer Passivation"). Limiting the lateral extension of the etch stop dielectric beyond the gate area and/or ohmic contact areas may also be useful to the extent that, for instance, a possibility of charge buildup in $Al_2O_3$ exists. In some cases, the etch stop layer is only present between the gate and drain, as shown and described below in connection with the embodiment of FIG. 4. With no $Al_2O_3$ in the source region at all, the configuration may be useful for minimizing source resistance. Using LPCVD $Si_3N_4$ only in the source region may minimize contact resistance because LPCVD $Si_3N_4$ passivated material has lower sheet resistance than $Al_2O_3$ passivated material.

Figure 2:
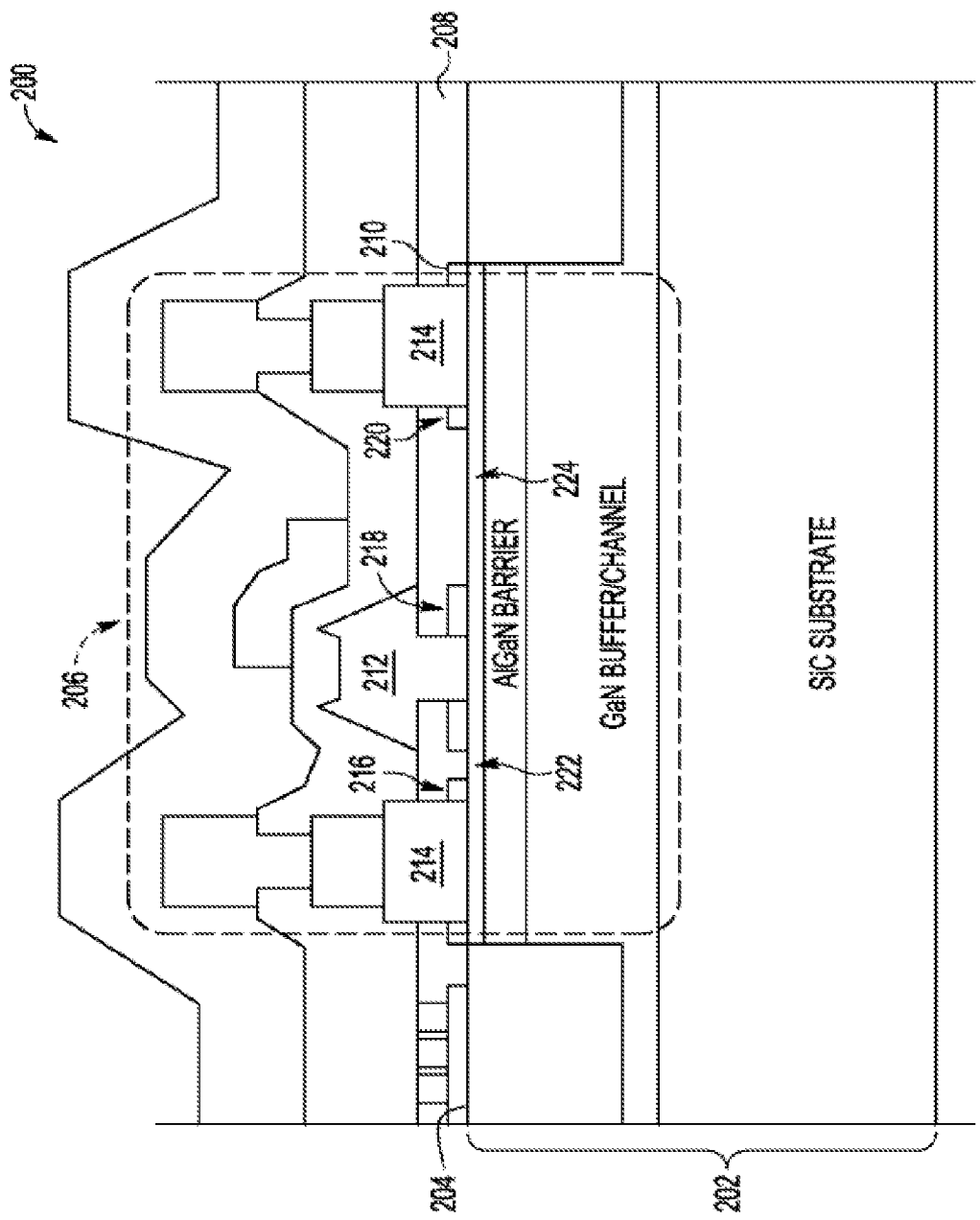
FIG. 2 is a schematic, cross-sectional view of a semiconductor device having selectively etched surface passivation layers, including a patterned surface passivation layer, in accordance with one embodiment.

FIG. 2 depicts another exemplary epitaxial GaN transistor device 200 having selectively etched dielectric layers for surface passivation. The transistor device 200 may include a semiconductor substrate 202 having epitaxial Group III-nitride semiconductor layers to define a channel, barrier layer, and cap layer, as described above. A number of other components of the transistor device 200 may be configured in a manner similar to the transistor device 100 of FIG. 1. For example, the epitaxial semiconductor layers may be grown on a similar base substrate to define a surface 204 of the semiconductor substrate 202, and isolated to define an active area 206 of the transistor device 200. The surface 204 is passivated by a dielectric layer 208 (e.g., $Si_3N_4$) and a patterned etch stop layer 210 (e.g., $Al_2O_3$). As described above, the dielectric layer 208 may be dry etched (e.g., using Fluorine-based chemistry) and the etch stop layer 210 may be wet etched to define openings for a gate 212 and ohmic contacts 214.

The patterning of the etch stop layer 210 determines which of the two dielectric layers and, thus, which dielectric material is used to passivate the surface 204 in a particular area. In this example, the etch stop layer 210 is disposed between the dielectric layer 208 and the surface 204 in areas 216, 218, and 220. Each area 216, 218, 220 corresponds with a portion of the active area 206 disposed over a channel of the transistor device 200. The areas 216, 220 may be adjacent to or abut a respective one of the ohmic contacts 214 (or the openings in which the contacts are disposed), while the area 218 may be adjacent to or abut the gate 212 (or the opening in which the gate 212 is disposed). The patterning of the etch stop layer 210 may thus limit the use of the etch stop to such areas in and around the gate 212 and the ohmic contacts 214. The remaining portion or portions of the surface 204 may be passivated by the dielectric layer 208. In this example, the dielectric layer 208 is disposed on the surface 204 in areas 222 and 224, which correspond with portions of the active area 206 over the channel between the gate 212 and the ohmic contacts 214. The areas 222 and 224 are accordingly spaced from the gate by the area 218, and from the ohmic contacts 214 by the area 216 or the area 220. The etch selectivity of the etch stop layer 210 protects the surface 204 in the openings for the gate 212 and the ohmic contacts from damage that would otherwise arise from the etchant of the dielectric layer 208.

The areas in which the etch stop layers of the disclosed devices are removed for $Si_3N_4$ or other surface passivation may vary. For example, the extent to which the etch stop layer extends beyond the area of the opening of the gate or ohmic contact may be customized, and may differ based on the device terminal. As shown in the examples described below, the etch stop layer may extend across the area between one of the ohmic contacts and the gate, while an area between the other ohmic contact and the gate is passivated by the other dielectric layer.

Figure 3:
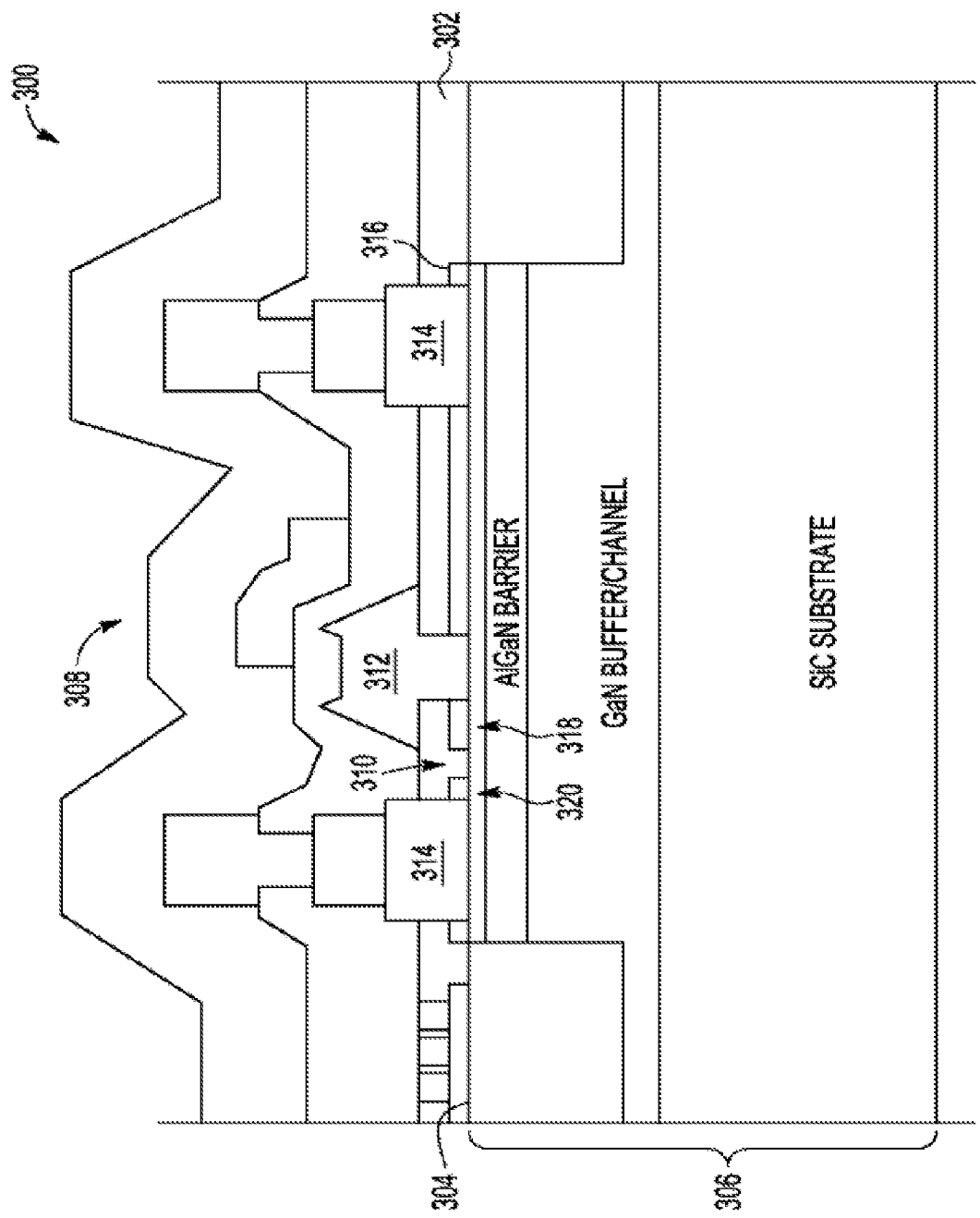
FIGS. 3-5 are schematic, cross-sectional views of semiconductor devices with a surface passivation layer patterned in accordance with various embodiments.

FIG. 3 depicts another exemplary transistor device 300 in which a dielectric layer 302 passivates a surface 304 of a semiconductor substrate 306 in a selected portion of an active area 308. The portion in this example is an area 310 between a gate 312 and one of a pair of ohmic contacts 314. To that end, an etch stop layer 316 is patterned to allow the surface 304 to be passivated by the dielectric layer 302 in the area 310. The etch stop layer 316 may include $Al_2O_3$ and the dielectric layer 302 may include $Si_3N_4$ as described above. The etch stop layer 316 may passivate the surface 304 in areas 318 and 320 in contact with or abutting the openings for the gate 312 and one of the ohmic contacts 314, respectively. The area 310 is spaced from the gate 312 and the ohmic contact 314 by the areas 318, 320, respectively. Unlike the embodiment of FIG. 2, however, the dielectric layer 302 is not disposed on or adjacent the surface 304 between the gate 312 and the other ohmic contact 314. In that area, the etch stop layer 316 passivates the surface 304.

Figure 4:
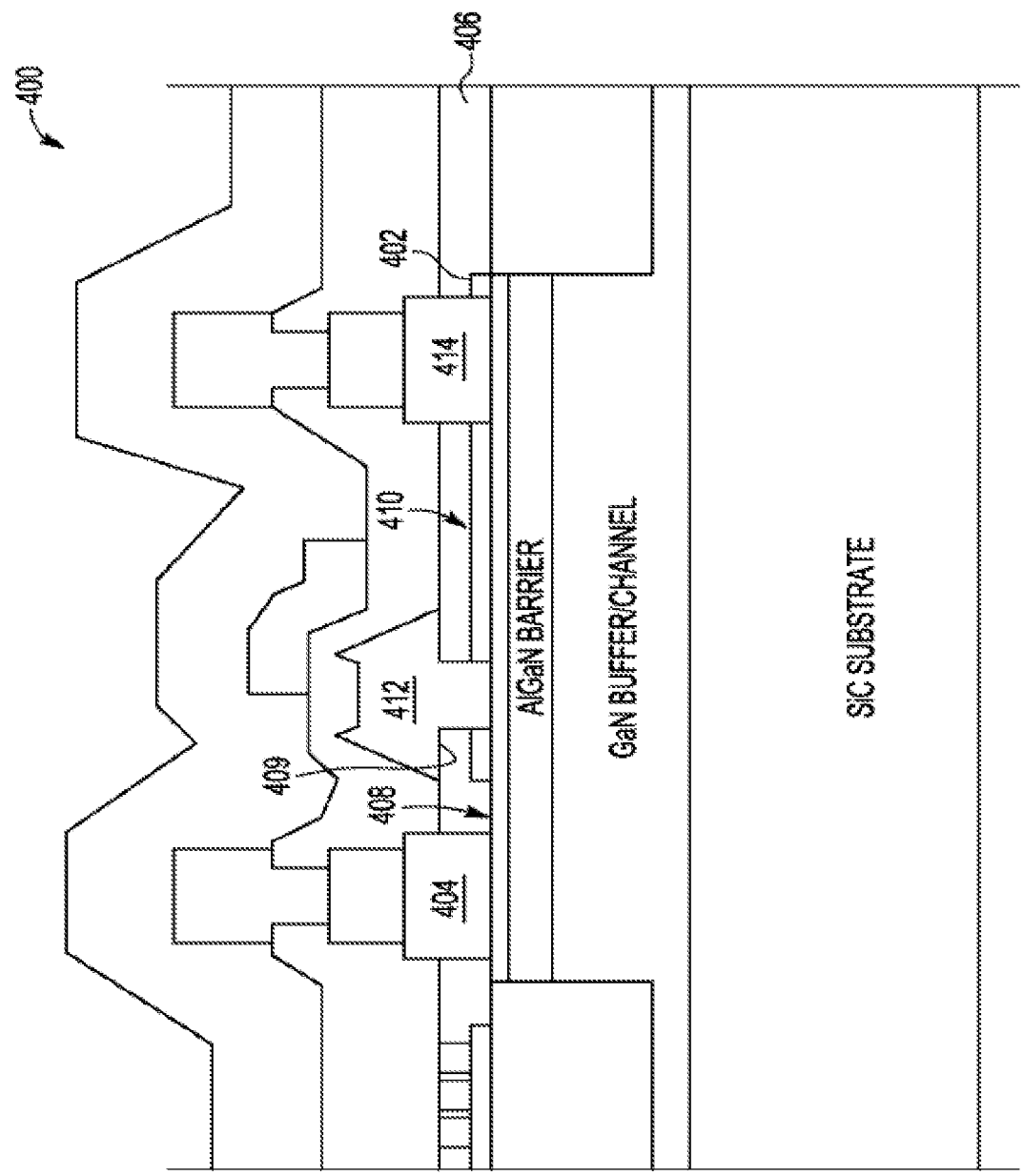
Figure 5:
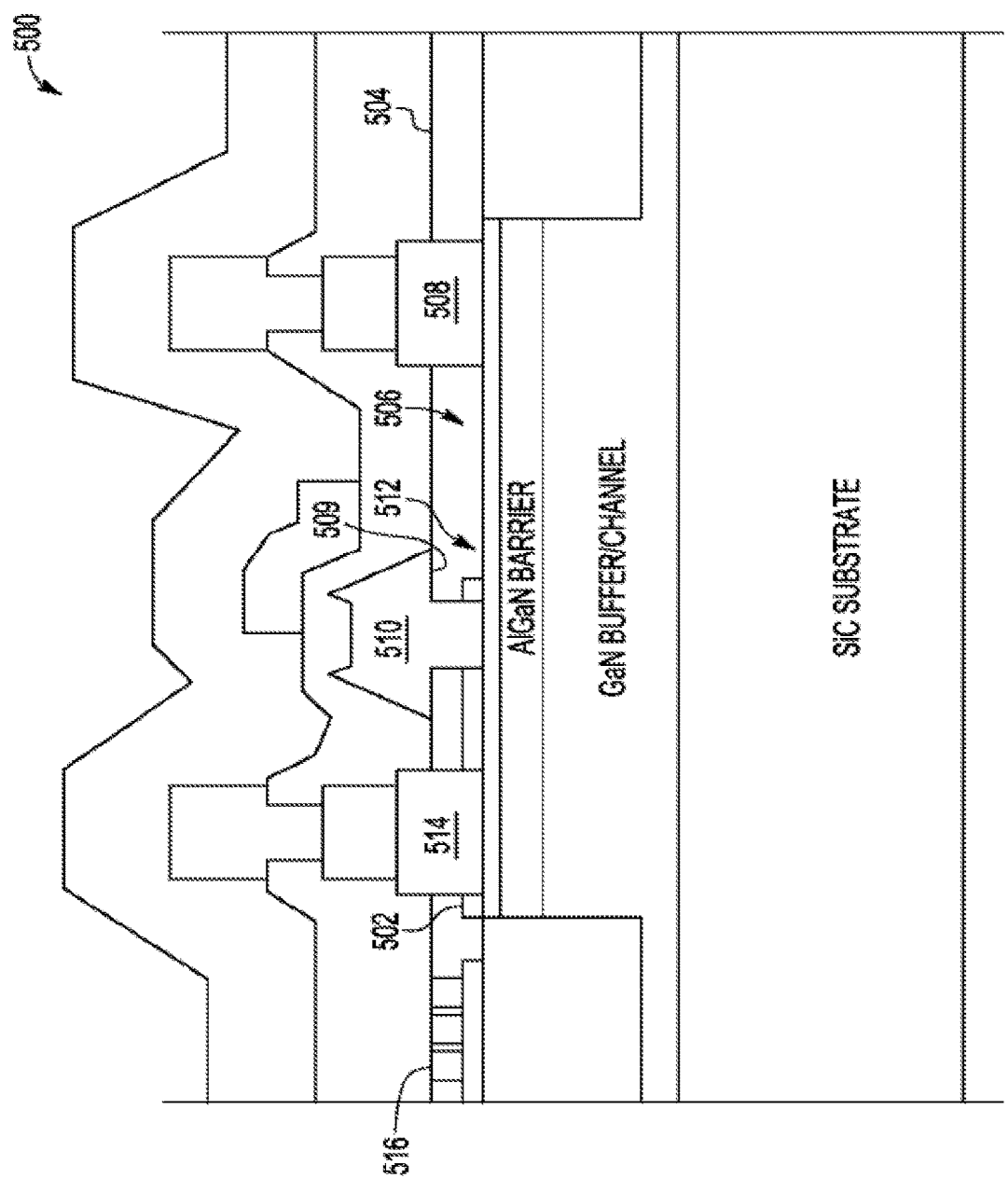
Figure 6:
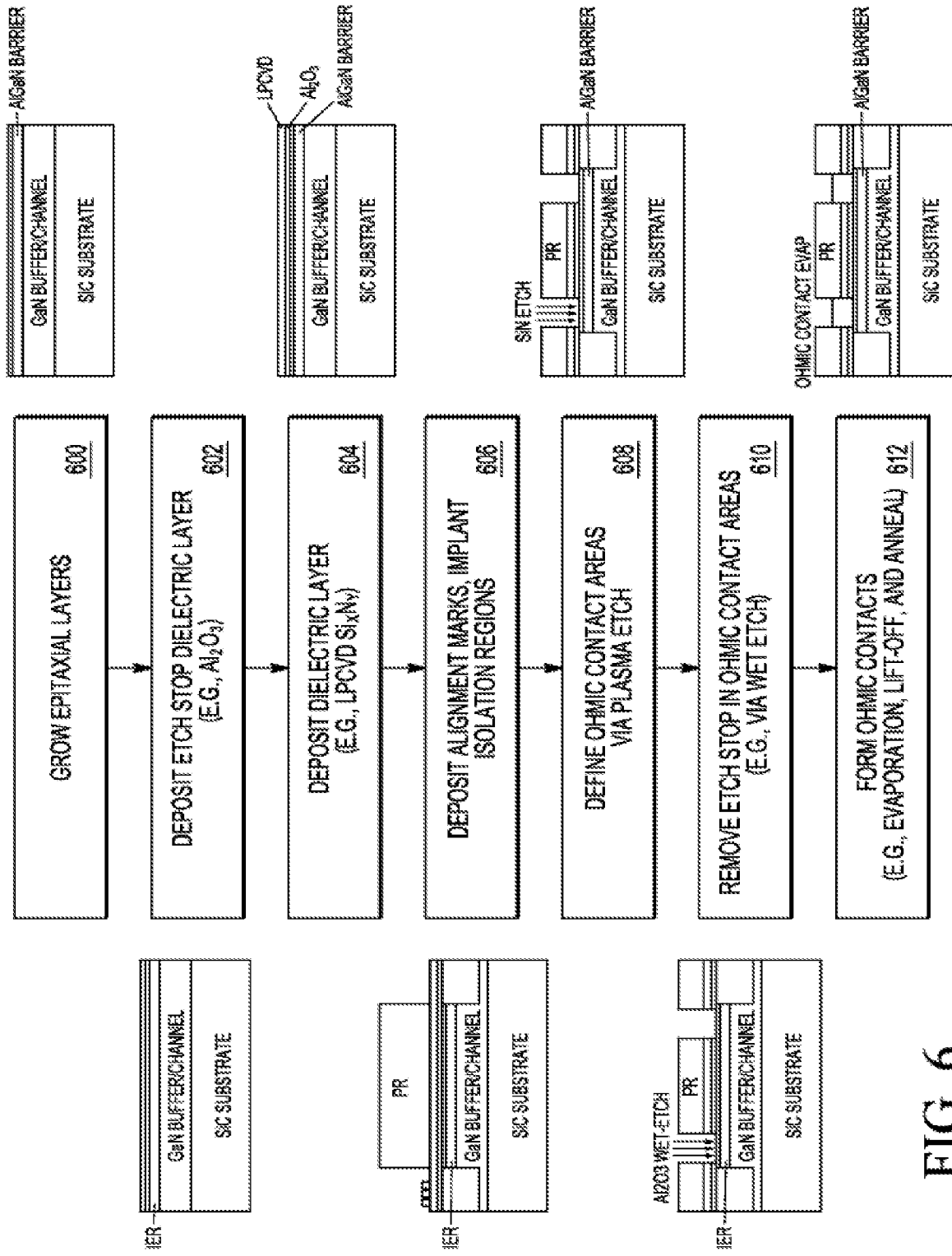
FIGS. 6-8 are flow diagrams and corresponding schematic, cross-sectional views illustrating an exemplary method of fabricating a semiconductor device involving selective etching of surface passivation layers in accordance with one embodiment.
Figure 11:
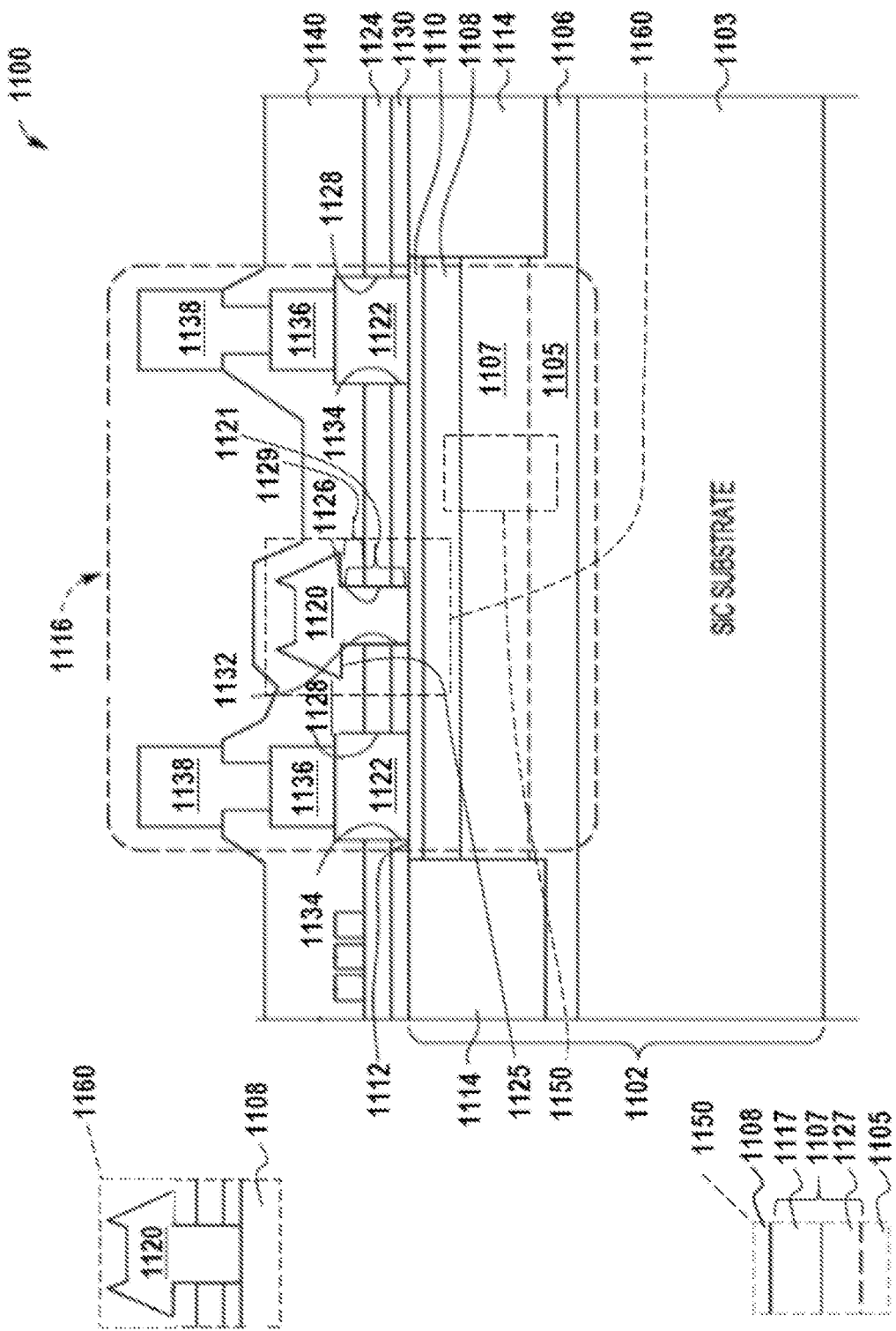
FIG. 11 is a schematic, cross-sectional view of a semiconductor device having selectively etched surface passivation layers and a T-gate, in accordance with one embodiment.

FIGS. 4, 5, and 11 depict further examples of etch stop layer patterning for selective surface passivation in transistor devices 400, 500, and 1100 respectively. The examples show that the patterning of the etch stop layer is not limited to configurations in which the $Si_3N_4$ layer passivates the surface of the semiconductor substrate only in an area (or areas) spaced from and between the pair of ohmic contacts. The patterning may instead remove the etch stop dielectric from areas (or portions of the active area) abutting one or both of the areas in which the openings for the ohmic contacts are formed.

In FIG. 4, an etch stop layer 402 is patterned such that the etch stop layer 402 does not abut an ohmic contact 404, which may be configured as a source terminal of the transistor device 400. The etch stop layer 402 may be removed entirely from the area in and around the ohmic contact 404. Alternatively, the etch stop layer 402 may be patterned such that the only remaining portion corresponds with the area to be defined as the opening for the ohmic contact 404. The etch stop layer 402 may thus protect the surface in the ohmic contact area during dry etch removal of a dielectric layer 406, such as $Si_3N_4$ as described above. In either case, the etch stop layer 402 does not extend beyond the ohmic contact 404 after formation of the ohmic contact 404. Instead, the dielectric layer 406 is thus disposed on the surface in an area 408 abutting the ohmic contact 404. In contrast, the surface is covered by the etch stop layer 402 in an area 410 between a gate 412 and another ohmic contact 414 (e.g., a drain terminal of the transistor device 400). Thus, the etch stop layer 402 abuts the ohmic contact 414. The lateral extent of the etch stop layer 402 in the area 408 may vary. For example, the etch stop layer 402 may either terminate under an overhang 409 or extend past the overhang 409.

In FIG. 5, the patterning of an etch stop layer 502 allows a dielectric layer 504 to be disposed on the surface over a wider area 506. The area 506 abuts an ohmic contact 508 as in the example of FIG. 4. The ohmic contact 508 may be configured as a drain terminal of the transistor device 500 in this case. Analogous to the description of the transistor device 400 in FIG. 4, the etch stop layer 502 may be patterned to terminate under or beyond an overhang 509 in an area 512 near a gate 510. The extent to which the dielectric layer 504 passivates the surface is thus increased in an area 512 near the gate 510 (e.g., under the overhang 509). The etch stop layer 502 may still cover the portion of the active area in which the opening for another ohmic contact 514 (e.g., a source contact) is eventually formed. In the example of FIG. 5 (and any other embodiments), alignment marks 516 may be used to align the patterning of the etch stop layer with an ohmic contact opening.

The structure, materials, positioning, and other characteristics of a number of the above-referenced components may vary from the examples shown. For example, as shown in the GaN transistor device 1100, depicted in FIG. 11, the gates of the above-described devices may be fabricated using a T-gate process where the gate metal only touches or abuts the $Si_3N_4$ (or other upper or top) dielectric layer along a stem of the gate (or other sidewall or vertical face thereof).

FIG. 11 depicts a cross sectional schematic view of an embodiment of the GaN transistor device 1100 analogous to the GaN transistor device 100 of FIG. 1. The GaN transistor device 1100 includes a semiconductor substrate 1102 and isolation regions 1114 that define an active area 1116 analogous to the isolation regions 114 and active area 116 of GaN transistor device 100 of FIG. 1. A first dielectric layer 1124 and a second dielectric layer 1130 may be disposed over semiconductor substrate 1102. The configuration of the semiconductor substrate 1102, isolation regions 1114, and the first and second dielectric layers 1124 and 1130 are analogous to and are described in connection with the GaN transistor device of FIG. 1. Ohmic contact openings 1128 and 1134 may be formed in the first dielectric layer 1124 and the second dielectric layer 1130, respectively. Ohmic contacts 1122 may be formed in ohmic contact opening 1128 and 1134 and may be supported by the semiconductor substrate 1102 in the active area 1116. Gate openings 1126 and 1132 may be formed laterally adjacent to and between ohmic contacts 1122 in first dielectric layer 1124 and second dielectric layer 1130, respectively. A T-gate 1120 may be formed in the gate openings 1128 and 1134 and supported by the semiconductor substrate in the active area 1116. In an embodiment, the T-gate 1120 may be directly contacted by the upper surface 1112 of semiconductor substrate 1102, forming a Schottky contact. In other embodiments (not shown), the second dielectric layer 1130 or other suitable dielectric may be used to form a gate dielectric between the T-gate 1120 and an upper surface 1112 of the semiconductor substrate 1102 analogous to the example metal insulator semiconductor field effect transistor (MISFET) device of FIG. 10.

Analogous to the semiconductors substrate 102 of FIG. 1, the semiconductor substrate 1102 may include a base substrate 1103, a buffer/channel layer 1106 disposed over the base substrate 1103, and a barrier layer 1108 disposed over the buffer/channel layer 1106, according to an embodiment. In an embodiment, the base substrate 1103 may include the same materials used to form the base substrate 103 of FIG. 1. The buffer/channel layer 1106 may include a lower buffer portion 1105 and a channel portion 1107. The lower buffer portion 1105 may include the same materials used to form the buffer portion 105 of FIG. 1.

In an embodiment, and analogous to the channel layer 107 of FIG. 1, the channel portion 1107 may include GaN, InGaN, or AlGaN layers in combination or alone. In an embodiment where GaN and/or InGaN are used in combination, and in a view 1150, the channel portion 1107 may include a channel region 1117 and a near-channel back barrier region 1127 disposed under the channel region 1117. The channel region 1117 may include GaN and the near-channel back barrier region 1127 may include InGaN, AlGaN, or other suitable materials. According to an embodiment, the near-channel back barrier region 1127 may be formed in a lower portion of the channel portion 1107 adjacent the buffer portion 1105. In an embodiment, the near-channel back barrier region 1127 may be grown in contact with the lower buffer portion 1105. In other embodiments (not shown), other layers may be formed between the near-channel back barrier region 1127 and the lower buffer portion 1105. The near-channel back barrier region 1127 of the channel portion 1107 may include an $In_XGa_{1-X}N$ layer where X may be between about 0.05 to about 0.15, according to an embodiment. In other embodiments, X may be between 0.02 and 0.5. Other larger or smaller values of X may be used, as well. The thickness of the near-channel back barrier region may be between about 10 and about 50 angstroms, according to an embodiment. In other embodiments, the near-channel back barrier region may be between about 5 and about 500 angstroms. Other larger or smaller thicknesses of the near-channel back barrier region may be used, as well. In an embodiment, the channel region 1117 may be formed in an upper portion of the channel portion 1107 adjacent the barrier portion 1108. The channel region 1117 may include GaN or other suitable materials. The thickness of channel region 1117 may be between about 50 angstroms and about 150 angstroms, according to an embodiment. In other embodiments, channel region 1127 may be between 10 angstroms and 1000 angstroms. Other larger or smaller values for the thickness of the channel region 1127 may be used as well. In some embodiments, and analogous with channel portion 107 of FIG. 1, GaN or $In_XGa_{1-X}N$ may be used as a single layer to form the channel portion 1107.

In an embodiment, the barrier layer 1108 may include the same materials (e.g. AlGaN) used to form the barrier layer 1108 of FIG. 1. The thickness of barrier layer 1108 may take values between about 50 angstroms and about 150 angstroms, according to an embodiment. In other embodiments, the thickness of the barrier layer 1108 may between about 10 angstroms and about 250 angstroms. Other smaller or larger thicknesses of the barrier layer 1108 may be used, as well. Analogous to the transistor device 100 of FIG. 1, an AlN interbarrier layer may be used between the barrier layer 1108 and the buffer/channel layer 1106. In an embodiment, a cap layer 1110 analogous to the cap layer 110 of the transistor device 100 of FIG. 1 may be disposed over the barrier layer 1108. In some embodiments, the cap layer 1110 may include the same material used to form the barrier layer 1108 (e.g. AlGaN). In other embodiments, the cap layer 1110 may be omitted as shown in view 1160.

In an embodiment, the first and second dielectric layers 1124 and 1130 may be disposed over the semiconductor wafer 1102. The first dielectric layer 1124, analogous to the first dielectric layer 124 of the transistor device 100 of FIG. 1, may include the same materials (e.g. LPCVD SiN) used to form the first dielectric layer 124 of FIG. 1, according to an embodiment. Likewise, in an embodiment, the second dielectric layer 1130 may include the same materials (e.g. ALD $Al_2O_3$) used to form the second dielectric layer 130 of FIG. 1. Analogous to the second dielectric layer 130 of the transistor device 100 of FIG. 1, the second dielectric layer 1130 may include materials (e.g. $Al_2O_3$) so as to be configured as an etch stop layer.

In an embodiment, a T-gate 1120 may be formed over and supported by the semiconductor substrate 1102. In an embodiment, a vertical stem 1121 of the T-gate 1120 may be disposed within the gate openings 1126 and 1132 in the first and second dielectric layers 1124 and 1130. A lateral overhang portion 1125 of the T-gate 1120 may be adjacent the vertical stem 1121 and separated from the first dielectric layer 1124 by a gate overhang gap 1129. In an embodiment, the gate overhang gap 1129 may be between about 1000 angstroms and about 2000 angstroms. In other embodiments, the gate overhang gap 1129 may be between about 100 angstroms and about 10,000 angstroms. Other larger or smaller values of the gate overhang gap 1129 may be used as well. In an embodiment, the T-gate 1120 may be disposed directly on the GaN cap 1110, analogous to the configuration of FIG. 1 wherein the gate 120 is disposed over the GaN cap 110. In other embodiments, and as depicted in a view 1160, the T-gate 1120 may be formed directly on the AlGaN barrier layer 1108. In these embodiments, the semiconductor substrate 1102 may not include the GaN cap layer 1110. In other embodiments (not shown), the semiconductor substrate 1102 may include a GaN cap layer 1110, but the GaN cap layer may be removed by recess etching in the region under T-gate 1120. Analogous to the transistor 100 of FIG. 1, embodiments of the GaN transistor device 1100 may include additional components such as ILD layers 1140, a metal layer 1136, and a second metal layer 1138. These components are analogous in form and function to ILD layers 140, the metal layer 136, and the second metal layer 138 of the transistor device 100 of FIG. 1. It should be appreciated that the embodiments of GaN transistor 1100 are exemplary and that other embodiments not shown are included in the inventive subject matter. For example, an embodiment (not shown) of GaN transistor device 1100 may include a field plate analogous to the field plate 142 of the transistor device 100 of FIG. 1. In other embodiments (not shown), the GaN transistor device 1100 may include patterned second dielectric layers (e.g. $Al_2O_3$) analogous to transistor devices 200-500 of FIGS. 2-5.

Figure 12:
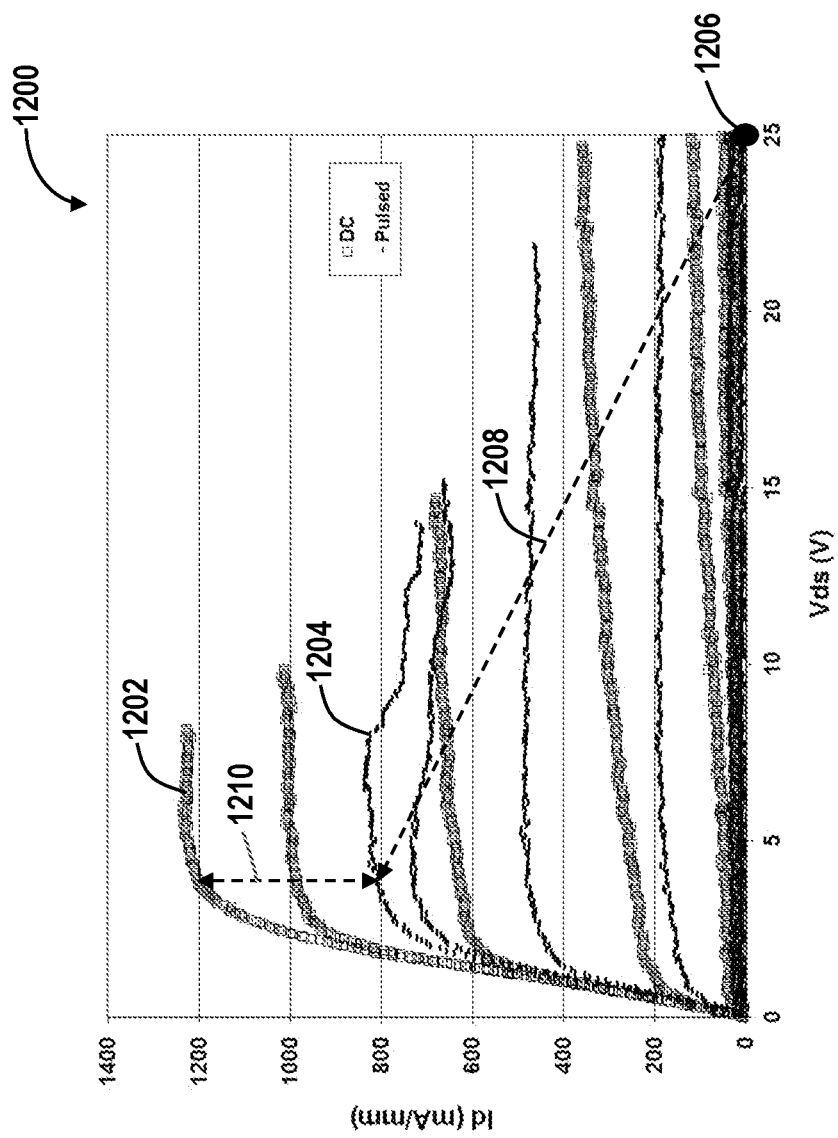
FIG. 12 depicts exemplary graphical representations of current versus voltage characteristics of an embodiment of a semiconductor device having a T-gate according to one embodiment.

FIG. 12 depicts an exemplary graphical representation 1200 of measured direct current (DC) and pulsed current versus voltage characteristics of an example GaN transistor device according to an embodiment of the GaN transistor device 1100 of FIG. 11. Characteristic 1202 shows the DC current voltage (I-V) characteristics of a partially-formed GaN transistor having a T-gate formed in contact with a GaN cap 1110. The embodiment of the GaN transistor 1100 of FIG. 11 described here has neither dielectric layers (e.g. ILD layer 140) disposed over the gate 1120 nor in the gate overhang gap 1129. Measuring the pulsed current characteristics of the partially formed GaN transistor 1100 of FIG. 11 without ILD layer 1140 in the region of the gate overhang gap 1129 allows comparisons of the surface trapping behavior without influence of the overlying dielectric layers and tends to accentuate surface trapping effects. Characteristic 1202 is obtained by varying the voltage across ohmic contacts 1122 (source and drain contacts) from 0 to 25 V in 0.25 V steps and the voltage applied to T-gate 1120 from −5V to +2 V in 1 V steps. A power limit of ten watts per millimeter of gate periphery is used to keep the voltage and current from exceeding the safe operating area of transistor 1100. Pulsed IV characteristic 1204 shows pulsed current voltage (I-V) characteristics of a the same partially-formed embodiment of GaN transistor device 1100 having a T-gate formed in contact GaN cap. Characteristic 1204 is obtained by sweeping the voltage across source and drain ohmic contacts 1122 from 0 to 25 V with 0.25 V steps and the voltage applied to T-gate 1120 from −5V to +2 V in 1 V steps. with a power. For these measurements, the device is biased at a quiescent (Q) point 1206 wherein a DC component of the drain-source bias is held constant at 25V, a DC component of the gate bias is held constant at −5V, and the drain bias is pulsed from the Q point 1206 along a trajectory (e.g. 1208) and repeated for each drain bias point along characteristic 1204. This drain voltage sweep is repeated for each gate bias (e.g. −5V to +2V in 1 V steps) until each point of pulsed IV characteristic 1204 is created. As seen from comparison of characteristic 1202 and characteristic 1204, a significant collapse 1210 of, for example, greater than 200 mA/mm exists in the characteristic 1204 because of trapping at the device surface. This trapping may reduce the pulsed drain current that can be achieved in characteristic 1204. This trapping may be reduced by adding one or more ILD layers 1140 over the gate 1140 and within the gate overhang gap 1120 or, as will be shown in FIG. 13, by omitting the GaN cap 1110 and depositing the T-gate 1120 directly on the AlGaN barrier layer.

Figure 13:
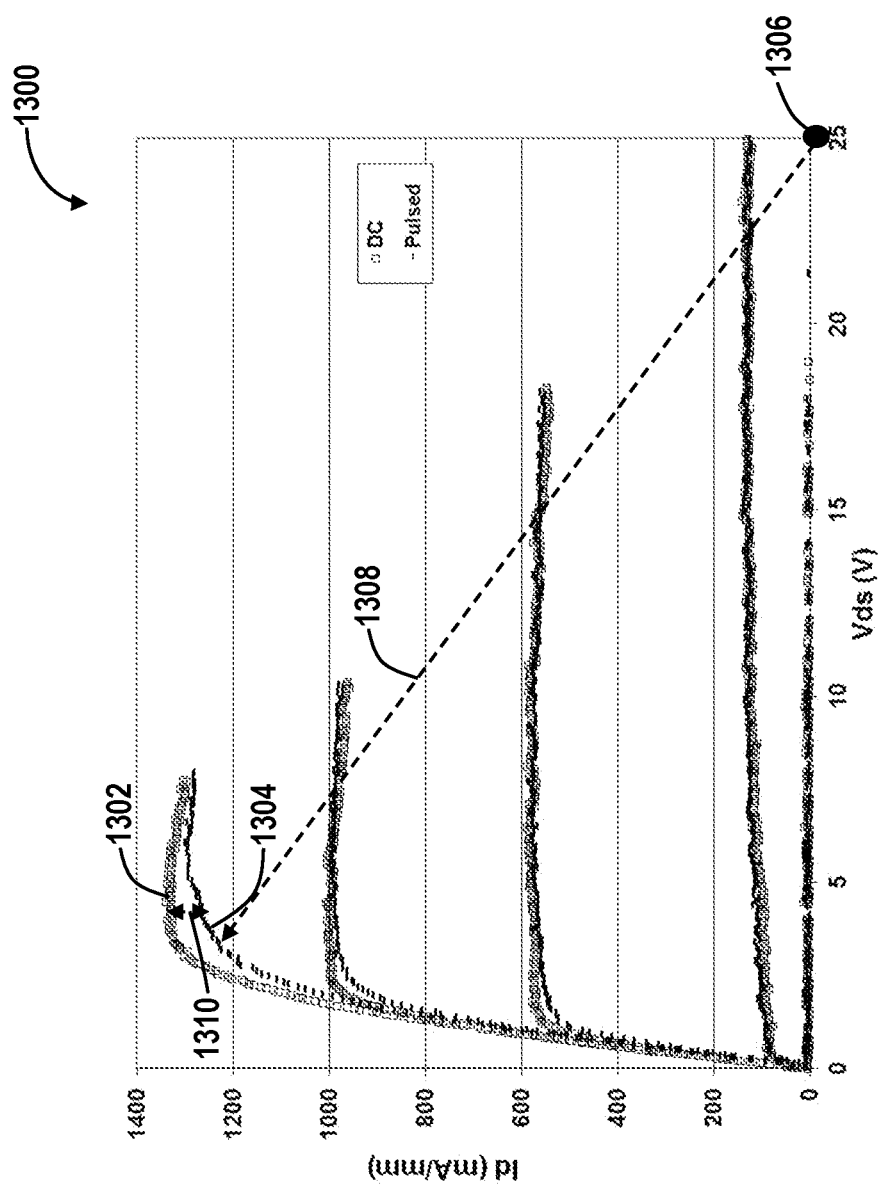
FIG. 13 depicts exemplary graphical representations of current versus voltage characteristics of an embodiment of a semiconductor device having a T-gate according to one embodiment.

FIG. 13 depicts an exemplary graphical representations of direct current (DC) and pulsed current versus voltage characteristics of an embodiment of a semiconductor device having the T-gate 1120 of FIG. 11 formed directly on the AlGaN barrier (i.e. device has no GaN cap 1110) according to the embodiment of view 1150. Characteristic 1302 shows the direct current (DC) current voltage (I-V) characteristics of a partially-formed GaN transistor having a T-gate formed directly on the AlGaN barrier 1108. Consistent with FIG. 12, the embodiment of the GaN transistor 1100 characterized here has neither dielectric layers disposed over the gate 1120 nor in the gate overhang gap 1129. Characteristic 1302 is obtained by sweeping the voltage across ohmic contacts 1122 (source and drain contacts) from 0 to 25 V with 0.25 V steps and the voltage applied to T-gate 1120 from −5V to +2 V in 1 V steps. A power limit of ten watts per millimeter of gate periphery is used to keep the voltage and current from exceeding the safe operating area of the transistor. Characteristic 1304 shows pulsed current voltage (I-V) characteristics of a partially-formed GaN transistor having a T-gate formed directly on the AlGaN barrier 1108. Characteristic 1304 is obtained by sweeping the voltage across source and drain ohmic contacts 1122 from 0 to 25 V with 0.25 V steps and the voltage applied to T-gate 1120 from −5V to +2 V in 1 V steps. with a power. For these measurements, the device is biased at a quiescent (Q) point 1306 and is pulsed from this Q point to all of the various gate and drain bias point of characteristic 1204. As seen from comparison of characteristic 1202 and characteristic 1304, a very small value of collapse (e.g. less than 50 mA/mm) 1310 exists in the characteristic 1304 because of lack of trapping at the device surface.

FIGS. 6-8 and 14 show exemplary methods of device fabrication involving selectively etched surface passivation according to embodiments of the inventive subject matter. As described above, the device fabrication method may address a number of challenges for HFET or HEMT devices, including gate leakage and/or ohmic contact resistance. The method includes a sequence of acts, only the salient of which are depicted for convenience in illustration. For example, the method may include a number of acts directed to preparing a base substrate for the assembly method. The ordering of the acts may vary in other embodiments. For example, an isolation implant procedure may be implemented after the annealing of the ohmic contacts.

The method may begin with an act 600 in which a number of epitaxial semiconductor layers are grown on a base substrate (e.g., SiC). The epitaxial semiconductor layers may be grown via one or more techniques, including, for instance, molecular beam epitaxy (MBE), metal-organic chemical vapor deposition (MOCVD), and hydride vapor phase epitaxy (HVPE). The growth of the epitaxial semiconductor layers includes defining a channel of the semiconductor device in a semiconductor substrate. In this example, the channel is defined by growing GaN or another suitable epitaxial Group III-nitride semiconductor layer on the base substrate. One or more additional epitaxial Group III-nitride semiconductor layers may be grown on the GaN channel layer to define, for instance, a barrier layer and a cap layer. With the growth of these and/or other semiconductor layers, the surface of the semiconductor substrate is defined for an active area of the semiconductor device. One or more of the channel, barrier, and/or cap layers may be deposited via non-epitaxial techniques.

Passivation of the surface begins with the deposition of an etch stop dielectric layer on the surface across the active area in act 602. The etch stop dielectric layer may include $Al_2O_3$. In one example, the surface (e.g., a GaN surface) is covered with a layer of $Al_2O_3$ having a thickness of about 3 nm to about 40 nm, or a thickness in the range of about 10 nm to about 30 nm. The act 602 may include the deposition of alternative etch stop materials ($HfO_2$) and/or additional dielectric materials ($SiO_2$). For example, the etch stop dielectric layer may include a dielectric stack including a lower or bottom layer of $SiO_2$ or other wet-etchable dielectric film and an upper or top layer of $Al_2O_3$ and/or $HfO_2$. The deposition of the etch stop dielectric layer(s) may be implemented via atomic layer deposition (ALD), PECVD, sputtering, evaporation, LPCVD, electron-cyclotron resonance (ECR) deposition, inductively coupled plasma (ICP), hot-wire CVD (HWCVD), catalytic CVD (CAT-CVD), MOCVD, MBE, HVPE, or other suitable procedure including deposition of these materials in-situ after (e.g., immediately after) epitaxial layer growth as in act 600, but before exposure to ambient conditions.

In act 604, the surface passivation continues with the deposition of a passivation layer on the etch stop dielectric layer. The passivation layer may include $Si_3N_4$ deposited via a LPCVD procedure. The passivation layer extends across the active area over the channel. In some embodiments, the $Si_3N_4$ is deposited via a technique other than an LPCVD procedure or may include more than one layer deposited by one or more techniques. For example, atomic layer deposition (ALD), PECVD, sputtering, evaporation, LPCVD, electron-cyclotron resonance (ECR) deposition, inductively coupled plasma (ICP), hot-wire CVD (HWCVD), catalytic CVD (CAT-CVD), MOCVD, MBE, HVPE or other suitable procedures including deposition of these materials may be used. In addition, surface passivation act 604 may take place after (e.g., immediately after) act 602 in the same deposition tool, but before exposure to ambient conditions. Materials including the epitaxial semiconductor layers, etch stop layers, and passivation layers deposited during acts 600, 602, and 604 may be deposited in-situ in the same or separate chambers of one tool without exposing the semiconductor substrate to ambient conditions.

The LPCVD procedure may be configured to avoid crystallization of the etch stop dielectric layer. For example, the etch stop layer may begin to crystallize at about 800° C. for $Al_2O_3$. Unfortunately, the quality of LPCVD $Si_3N_4$ may begin to degrade at about that temperature, with significant decreases in quality possible by about 700° C. The LPCVD procedure may thus be implemented at a temperature between about 700° C. and about 800° C. In some embodiments, the LPCVD temperature is about 750° C. In other embodiments, the LPCVD procedure may be implemented between about 600° C. and about 750° C.

The active area is defined in act 606 via patterning of a photoresist layer and implantation of isolation regions. A number of alignment marks may be deposited outside of the active area before the implantation. The alignment marks may be formed using Si, Titanium-Platinum or other combination or material that provides suitable optical contrast or electron diffraction for e-beam alignment and withstands high-temperature anneals. The alignment marks are schematically shown, such that the positioning of the alignment marks is not necessarily above or otherwise aligned with the isolation region. After the isolation implant and alignment mark deposition, the photoresist may then be removed.

In act 608, ohmic contact areas may be defined by dry etching the LPCVD $Si_3N_4$ of the passivation layer. In preparation for the dry etch or RIE procedure, a layer of photoresist is applied and patterned as shown. Various plasma etchants may then be used to remove the passivation layer, including, for instance, Fluorine-based etchants, such as $SF_6$, $CF_4$, etc. In some cases, the etch procedure forms aluminum fluoride (AlF) on the surface of the $Al_2O_3$ layer, thereby stopping the SiN etch. The dry etch procedure may be implemented at a sufficiently low power level (e.g., corresponding with about 30 to about 100 Volts DC bias) to avoid remote damage to the underlying layers (e.g., by passing through the $Al_2O_3$ etch stop layer).

Once the openings in the LPCVD $Si_3N_4$ of the passivation layer are formed, the etch stop dielectric layer may be removed in the ohmic contact areas via a wet etch procedure in act 610. Various wet etchants may be used, including, for instance, hydrofluoric acid (HF), BOE, and hot hydrochloric acid (HCl). One or more etchants may be used in connection with embodiments having a dielectric stack beneath the LPCVD $Si_3N_4$ layer. In addition, the ohmic contacts may be recessed using Cl-based chemistry such as $Cl_2$, $BCl_3$, $SiCl_4$ or other suitable dry or wet chemistry that etches Group III-V nitrides.

In act 612, the ohmic contacts are formed in the ohmic contact areas. One or more ohmic contact metals and/or other materials are deposited in the opening via evaporation, sputtering, or other procedures. For example, the procedure may include evaporating silicon to cover the surface of the semiconductor substrate in the contact areas before one or more metals may be evaporated (e.g., titanium and aluminum), thereby forming a silicide at the interface. Once the metal layers are deposited, a lift-off is implemented to remove the photoresist and metals from outside of the ohmic contact areas. Formation of the ohmic contacts may then include the implementation of an anneal procedure. In one embodiment, the ohmic metal layers are annealed at less than 825° C. In another embodiment, the ohmic metal layers are annealed at less than 800° C. In still other embodiments, the ohmic metal layers are annealed at less than 750° C. The anneal time is optimized to reduce ohmic contact resistance and may last between about 30 and about 90 seconds, although shorter or longer times may be used.

The configuration, materials, and other characteristics of the ohmic contacts may be selected to allow the anneal temperature to stay below the crystallization temperature of the etch stop dielectric layer. Implementing the anneal procedure at an anneal temperature lower than 800° C. may avoid such crystallization and thus the creation of leakage paths. In some cases, the quality of the etch stop dielectric material may begin to degrade at about 800° C. The annealing temperature may thus be set between about 700° C. and about 800° C., a range in which low-temperature ohmic contact configurations remain available. In some embodiments, the anneal temperature is about 750° C. to match the temperature of the LPCVD procedure described above. For instance, the formation of the ohmic contact may include creating a recess in the semiconductor substrate before the evaporation of ohmic contact materials. Alternative or additional materials may be used, including the evaporation of Silicon tetrachloride into a recess, or the evaporation of Tantalum as a first metal layer instead of Titanium.

Figure 7:
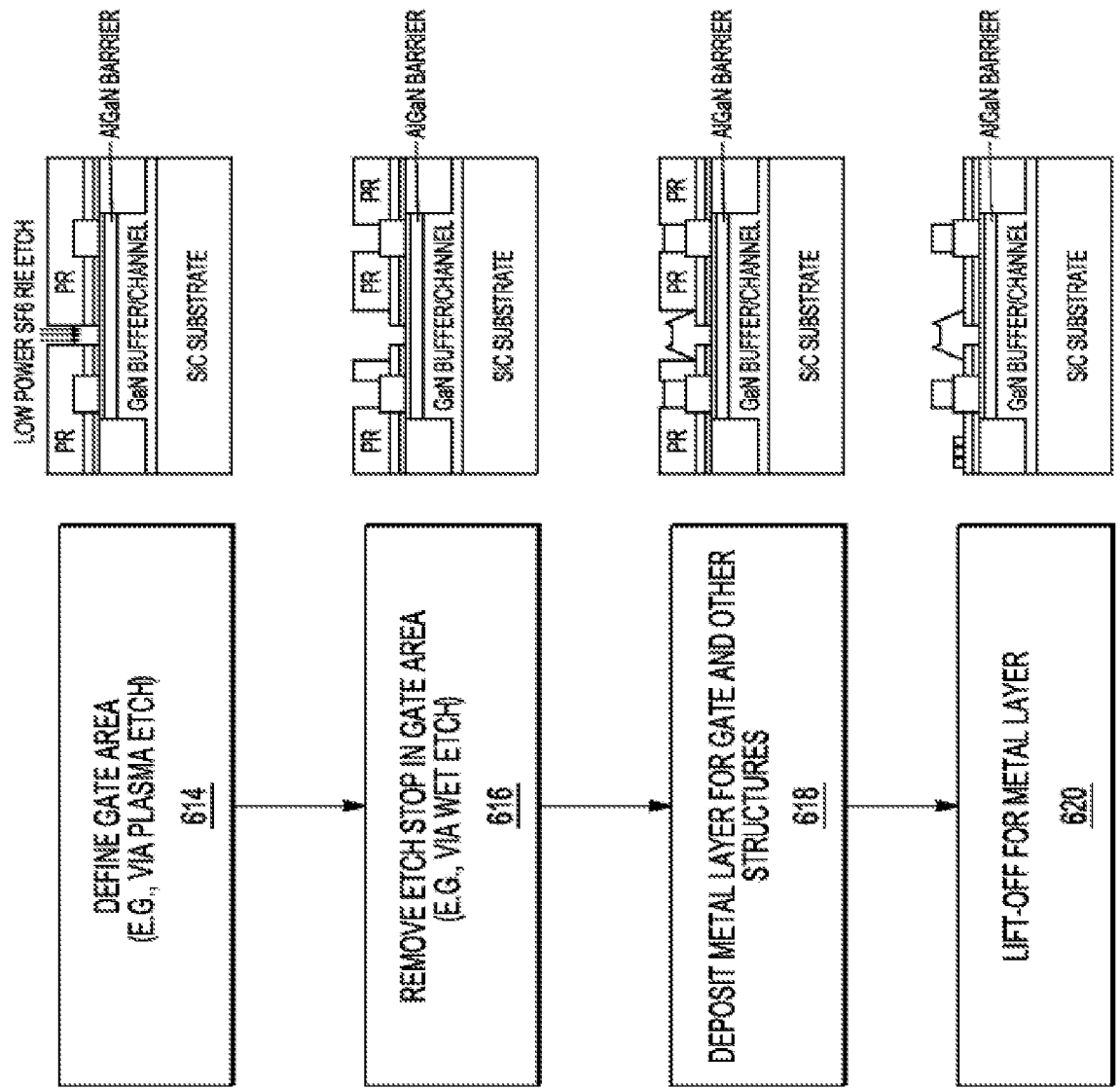

FIG. 7 shows a number of acts directed to form a gate of the device. A gate area is defined in act 614 by patterning a photoresist layer and dry etching the $Si_3N_4$ passivation layer. The RIE procedure may define the stem of the gate. Any one of the plasma etchants referenced above may be used, such that the etch is again stopped by the $Al_2O_3$ layer. In some embodiments, the etch stop dielectric layer may then be removed in the gate area in act 616 via a wet etch procedure using one of the wet etchants referenced above. In other embodiments, the etch stop dielectric layer is not removed (see, e.g., the embodiment of FIG. 10). In such cases, a separate cleaning procedure, e.g., using dilute HCl at room temperature or other cleaning compound that minimally etches the $Al_2O_3$ layer, may be used to clean the device surface prior to gate metal deposition. A gate contact is then formed in act 618 in the gate area to form either a Schottky gate or a metal-insulator gate. One or more gate metal layers may be deposited via evaporation, sputtering, or other techniques. In one embodiment, the gate metals include Nickel (Ni) and Gold (Au), with an optional Palladium (Pd) layer deposited on the Ni—Au structure. The gate metal layer(s) may also be deposited on the ohmic contact structures as shown. A metal lift-off procedure is then implemented in act 620 to remove the photoresist layer.

Figure 14:
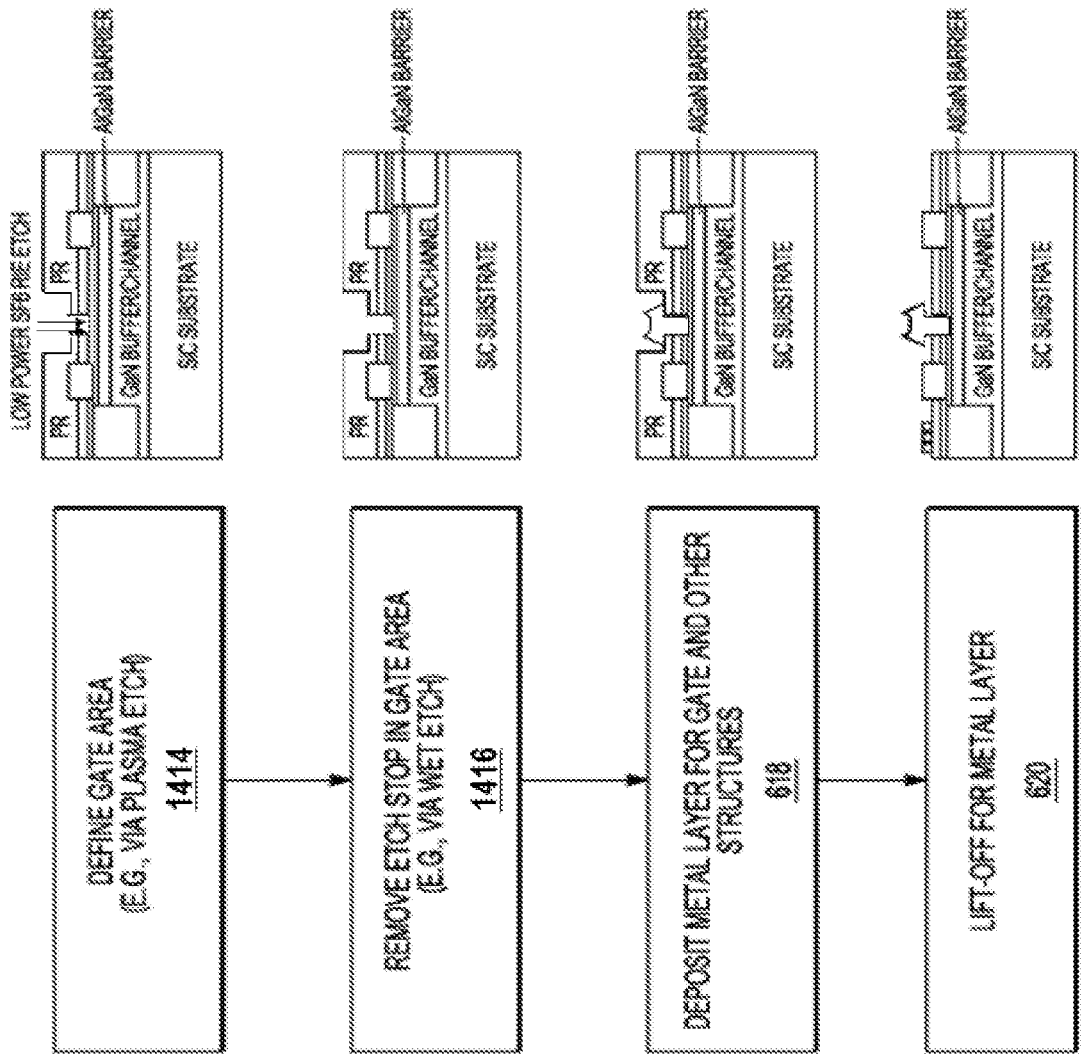
FIG. 14 is a flow diagram and corresponding schematic, cross-sectional views illustrating an exemplary method of fabricating a semiconductor device involving selective etching of surface passivation layers in accordance with one embodiment.

FIG. 14 depicts a number of acts directed to an alternate method for forming a gate of a device (e.g. a T-gate of the GaN transistor device 1100 embodiment of FIG. 11). A gate area may be defined in act 1414 by patterning photoresist or electron-beam lithography resist layer(s) and dry etching the $Si_3N_4$ passivation layer. The resist patterning process may use a bi-layer process and photo or e-beam exposure to simultaneously define the gate stem and the gate head and gate overhangs to form a T-gate profile. The RIE procedure may define the stem of the gate by etching the SiN layer. Any one of the plasma etchants referenced above may be used, such that the etch is again stopped by the $Al_2O_3$ layer. In some embodiments, the etch stop dielectric layer may then be removed in the gate area in act 1416 via a wet etch procedure using one of the wet etchants referenced above. In other embodiments, the etch stop dielectric layer may not be removed (see, e.g., the embodiment of FIG. 10). In such cases, a separate cleaning procedure, e.g., using dilute HCl at room temperature or other cleaning compound that minimally etches the $Al_2O_3$ layer, may be used to clean the device surface prior to gate metal deposition. A gate contact may then be formed in act 1418 in the gate area to form either a Schottky gate or a metal-insulator gate. One or more gate metal layers may be deposited via evaporation, sputtering, or other techniques. In one embodiment, the gate metals include Ni and Au, with an optional Pd layer deposited between the Ni and Au in the Ni—Au structure. A metal lift-off procedure may then implemented in act 1420 to remove the resist layer.

Figure 8:
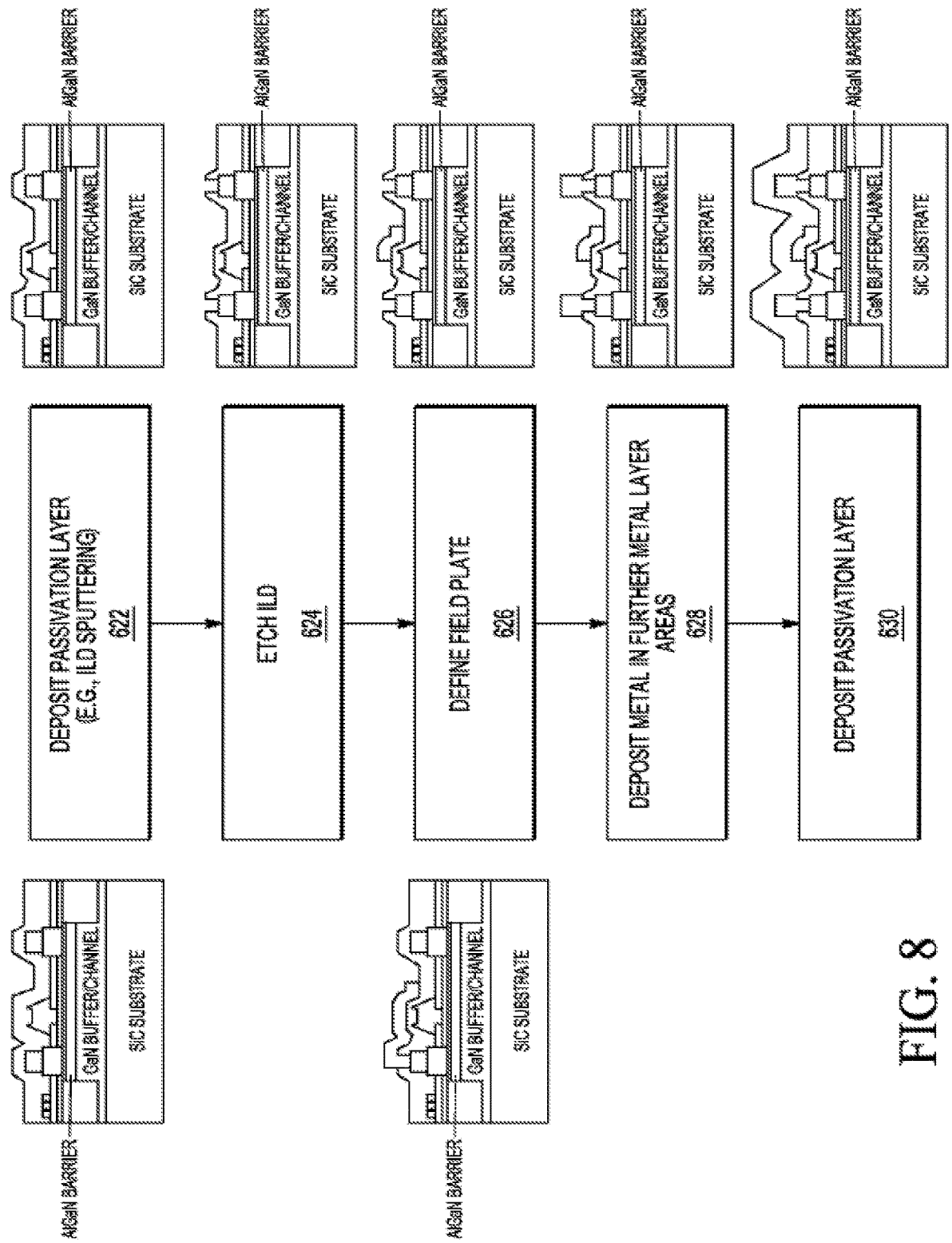

FIG. 8 shows a number of acts directed to completing the fabrication of the device. Multiple cross-sections are depicted for a number of the acts. In act 622, a first device passivation layer is deposited via, for instance, a SiN sputtering procedure. Other procedures may be used, including, for instance, PECVD, ICP, ECR-based deposition techniques. A field plate is defined via deposition of a metal layer in act 624. The first device passivation layer is etched in act 626 to define further metal layer areas. A metal layer is deposited in act 628 and a second device passivation layer is deposited in act 630.

Figure 9:
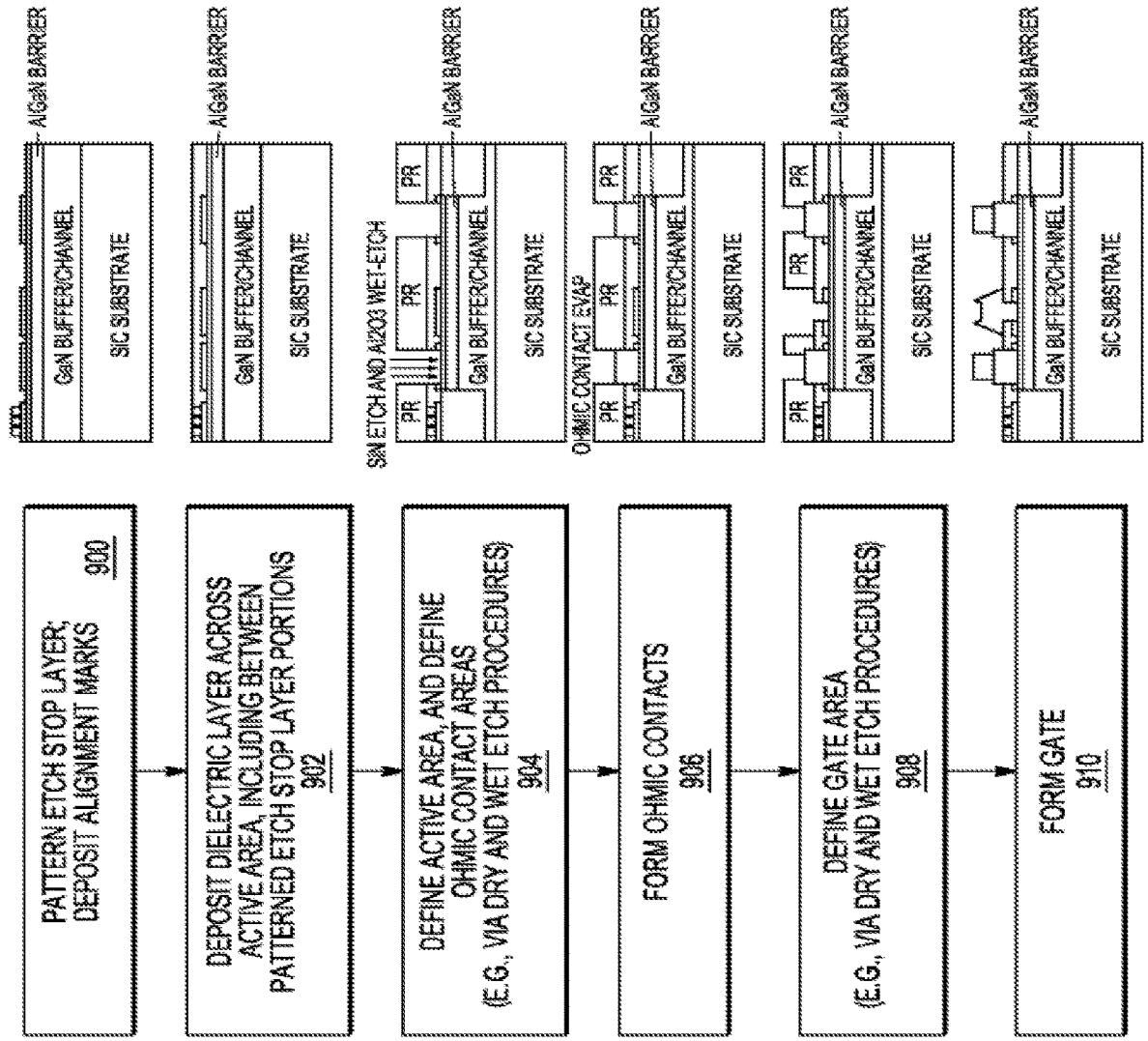
FIG. 9 is a flow diagram and corresponding schematic, cross-sectional view illustrating an exemplary method of fabricating a semiconductor device involving selective etching of surface passivation layers in accordance with another embodiment.

FIG. 9 shows an exemplary method of device fabrication in accordance with an embodiment in which the etch stop dielectric layer is patterned after being deposited on the surface of the semiconductor substrate, as shown in connection with act 900. The etch stop dielectric layer is patterned in the active area to expose one or more portions of the active area in which another dielectric layer, e.g., a $Si_3N_4$ layer, is used to passivate the surface. The one or more portions of the active area are disposed over the channel of the device, e.g., between the gate and one or both of the ohmic contacts, as described above.

A passivation layer including, for instance, $Si_3N_4$, is then deposited across the active area in act 902. The passivation layer is disposed on the remaining portions of the etch stop dielectric layer in some areas and between such portions on the surface of the semiconductor substrate in the exposed areas. A number of procedures may be implemented as part of act 904, including the definition of alignment marks and the active area using an implant isolation procedure as described above. The ohmic contact areas may be defined and opened via dry and wet etch procedures as described above. In the example shown, both of the ohmic contact openings fall within one of the patterned etch stop layers. Other embodiments may have etch stop patterns that correspond or are aligned with the openings, and/or have one or more openings be defined without any etch stop present. The ohmic contacts are then formed in act 906, and may include one or more procedures configured to prevent the crystallization of the etch stop layer as described above.

The process may then continue with the definition of the gate area in act 908 via photoresist patterning and corresponding dry and wet etch procedures to remove the $Si_3N_4$ layer and the etch stop layer, respectively. A gate contact may then be formed in the gate area in act 910. In this example, the gate contact is a Schottky contact. In an alternative embodiment, the etch stop layer is not removed before the gate contact is formed. The process may include a number of other acts similar to those described above in connection with the previous embodiment to complete the device fabrication.

Figure 10:
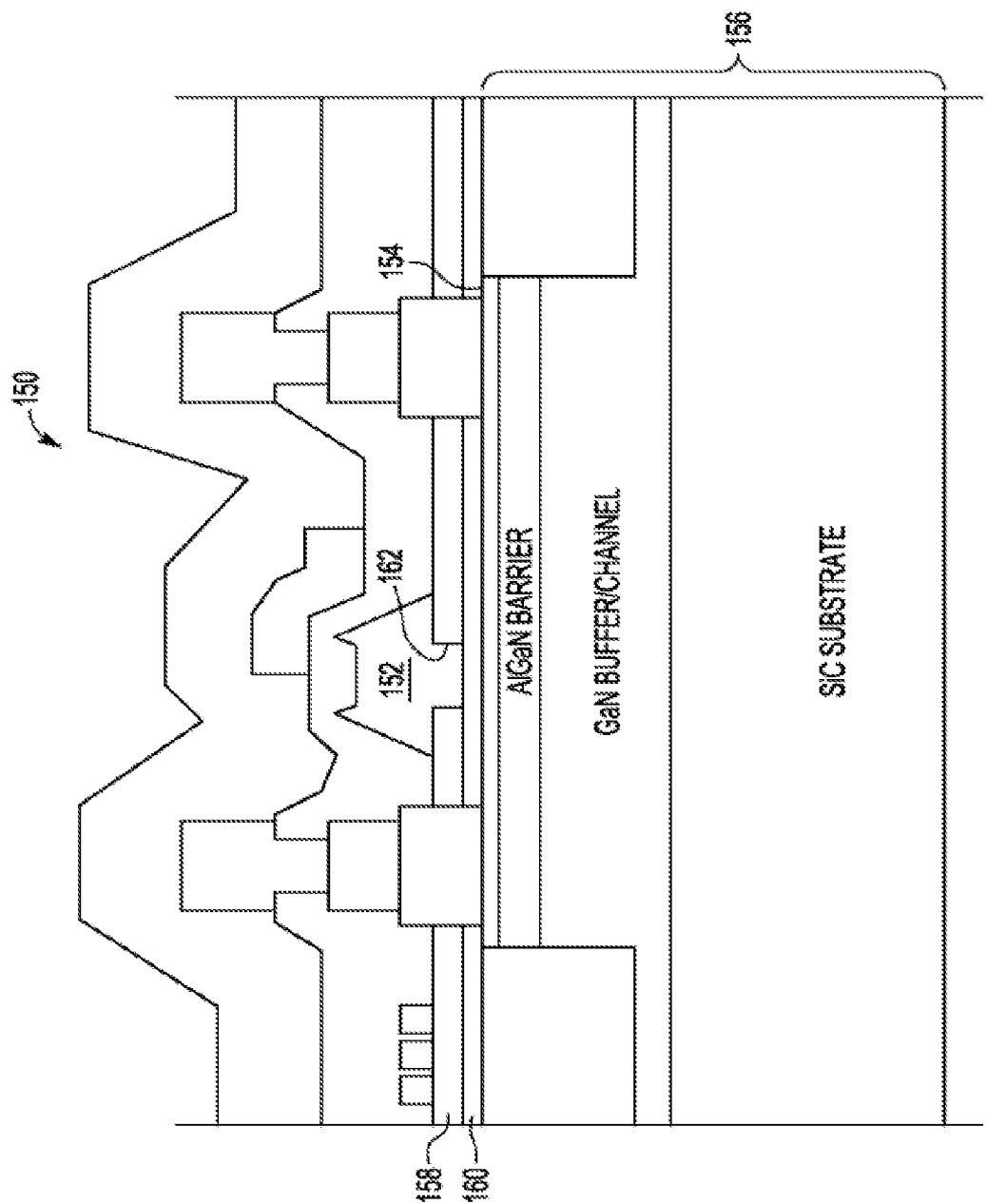
FIG. 10 is a schematic, cross-sectional view of a semiconductor device having selectively etched surface passivation layers without wet-etching of the surface passivation layer in contact with a semiconductor substrate in accordance with one embodiment.

FIG. 10 depicts a transistor device 150 having a gate 152 disposed in a metal-insulator gate configuration at a surface 154 of a semiconductor substrate 156. The transistor device 150 may thus be configured as a MISFET device. The transistor device 150 may have a number of components and structures in common with the embodiment shown in FIG. 1. For instance, the transistor device 150 includes first and second dielectric layers 158 and 160 as selectively etched surface passivation layers. The first and second dielectric layers 158 and 160 may be configured as described above. In this embodiment, only the first dielectric layer 158 has an opening 162 in which the gate 152 is disposed. The second dielectric layer 160 is disposed between the gate 152 and the surface 154 to establish the metal-insulator configuration.

The configuration of the MISFET device may vary from the example shown in FIG. 10. For example, the second dielectric layer 160 may be patterned to allow the first dielectric layer 158 to passivate the surface 154 in one or more portions of the active area.

Embodiments of a semiconductor device and methods of fabrication have been disclosed in the foregoing. In an embodiment, the semiconductor device may include a semiconductor substrate configured to include a channel and a gate supported by the semiconductor substrate to control the current flow through the channel. The first and second dielectric layers may be supported by the semiconductor substrate, according to an embodiment. In an embodiment, the gate may extend through respective openings in the first and second dielectric layers such that the gate abuts the first and second dielectric layers along a vertical stem of the gate. In an embodiment, a lateral overhang portion of the gate laterally adjacent the vertical stem and above a surface of the semiconductor substrate may be separated from the first dielectric layer by a gate overhang gap. The second dielectric layer may be disposed between the first dielectric layer and the surface of the semiconductor substrate. The second dielectric layer may include a wet etchable material having an etch selectivity to a dry etchant of the first dielectric layer. The semiconductor device of claim 1, wherein the semiconductor layer comprises a Group III-nitride semiconductor material. An embodiment of the semiconductor device may include first and second ohmic contacts supported by the semiconductor substrate, in ohmic contact with the semiconductor substrate, and spaced from one another for current flow between the first and second ohmic contacts through the channel. The gate may be disposed between the first and second ohmic contacts, according to an embodiment. In an embodiment, the gate may contact a barrier layer disposed over the channel. In an embodiment, the semiconductor device may include a barrier layer that includes aluminum gallium nitride. An embodiment of the semiconductor device may include a buffer/channel layer disposed over the base substrate and underneath the channel region. In an embodiment, the channel portion of the buffer/channel layer may include a near-channel back-barrier region disposed over a buffer portion of the buffer/channel layer and under a channel region of the channel portion. In an embodiment, the near-channel back-barrier region may include indium gallium nitride. In an embodiment, the indium gallium nitride has an indium mole fraction of between 0.05 and 0.15.

Another embodiment of the inventive subject matter may include a heterostructure field effect transistor (HFET) device that includes a semiconductor substrate comprising a base substrate and a Group III nitride semiconductor epitaxial layer supported by the base substrate. In an embodiment, the semiconductor substrate may be configured to include a channel. The semiconductor substrate may include at least one isolation region defining an active area along a surface of the semiconductor substrate, according to an embodiment. An embodiment of the HFET device may include first and second ohmic contacts supported by the semiconductor substrate in the active area and in ohmic contact with the channel for current flow through the channel. An embodiment of the HFET device may also include a gate supported by the semiconductor substrate and between the ohmic contacts and in contact with a barrier layer disposed over the channel to control the current flow through the channel. The first and second dielectric layers may be supported by the semiconductor substrate in an embodiment. The first and second ohmic contacts and the gate may extend through respective openings in the first and second dielectric layers. In an embodiment, the first and second dielectric layers may abut the gate along a vertical stem of the gate, and a gate overhang gap may separate the lateral overhangs of the gate from the first dielectric layer. The second dielectric layer may be disposed between the first dielectric layer and the surface of the semiconductor substrate according to an embodiment. The second dielectric layer may include a wet etchable material having an etch selectivity to a dry etchant of the first dielectric layer in an embodiment. An embodiment of the HFET device may include a buffer/channel layer disposed over the base substrate and underneath the channel region. A channel portion of buffer/channel layer may include a near-channel back-barrier region disposed over a buffer portion of the buffer/channel layer and underneath a channel region of the channel portion. The near-channel back-barrier region may include indium gallium nitride, according to an embodiment.

A method of fabricating a semiconductor device has also been disclosed. In an embodiment, the method may include defining an active area of the semiconductor device along a surface of a semiconductor substrate. In an embodiment, the method also may include depositing an etch stop dielectric layer on the surface in the active area, depositing a passivation layer on the etch stop dielectric layer, defining an ohmic contact area by dry etching the passivation layer, removing the etch stop dielectric layer in the ohmic contact area via a wet etch, forming an ohmic contact in the ohmic contact area, and forming a gate adjacent to the ohmic contact. Forming the gate may include forming a lateral overhang of the gate that is separated from the passivation layer by a gate overhang gap. Embodiments of the method may include patterning the etch stop dielectric layer to expose a portion of the active area such that depositing the passivation layer includes depositing the passivation layer on the surface in the portion of the active area. In embodiments of the method, the semiconductor substrate may include a base substrate with first and second Group III-nitride semiconductor layers epitaxially grown on the base substrate. In an embodiment of the method, the first Group III-nitride semiconductor layer may be configured to include the channel. Depositing the etch stop dielectric layer may be implemented in situ with growing the first and second epitaxial Group III-nitride semiconductor layers, according to one embodiment of the method. In an embodiment of the method, the second dielectric layer may include Aluminum oxide. Depositing the passivation layer may include implementing a low pressure chemical vapor deposition (LPCVD) at an LPCVD temperature below the crystallization temperature of the etch stop dielectric layer, according to an embodiment. In some embodiments, the LPCVD temperature may between about 600° C. and about 750° C. An embodiment of the method may include defining a gate area by dry etching the passivation layer; and removing the etch stop dielectric layer in the gate area via the wet etch.

What is claimed is:

1. A semiconductor device comprising:
 a semiconductor substrate configured to include a channel;
 a gate that includes a lateral overhang portion and is supported by the semiconductor substrate to control the current flow through the channel;
 first and second dielectric layers supported by the semiconductor substrate, wherein the gate extends through a gate opening in the first and second dielectric layers, wherein the gate abuts the first and second dielectric layers along a vertical stem of the gate and wherein the lateral overhang portion of the gate laterally adjacent the vertical stem and above a surface of the semiconductor substrate is separated from the first dielectric layer by a gate overhang gap, wherein a portion of an upper surface of the gate over the gate opening is recessed below at least a portion of the lateral overhang portion of the gate, and wherein the first dielectric layer directly contacts the second dielectric layer under the gate overhang gap;
 first and second ohmic contacts supported by the semiconductor substrate, in ohmic contact with the semiconductor substrate, and spaced from one another for current flow between the first and second ohmic contacts through the channel, wherein the gate is disposed between the first and second ohmic contacts, and wherein the second dielectric layer contacts the first and second ohmic contacts;
 wherein the second dielectric layer is disposed between the first dielectric layer and the surface of the semiconductor substrate; and
 wherein the second dielectric layer comprises a wet etchable material having an etch selectivity to a dry etchant of the first dielectric layer.

2. The semiconductor device of claim 1, wherein the semiconductor substrate comprises a Group III-nitride semiconductor material.

3. The semiconductor device of claim 2 wherein the gate contacts a barrier layer disposed over the channel.

4. The semiconductor device of claim 3 wherein the barrier layer comprises aluminum gallium nitride.

5. The semiconductor device of claim 2, further comprising a buffer/channel layer disposed over a base substrate and underneath the channel.

6. The semiconductor device of claim 5, wherein a channel portion comprises a near-channel back-barrier region disposed over a buffer portion of the buffer/channel layer and under a channel region of the channel portion.

7. The semiconductor device of claim 6, wherein the near-channel back-barrier region comprises indium gallium nitride.

8. The semiconductor device of claim 7, wherein the indium gallium nitride has an indium mole fraction of between 0.05 and 0.15.

9. A heterostructure field effect transistor (HFET) device comprising:
 a semiconductor substrate comprising a base substrate and a Group III nitride semiconductor epitaxial layer supported by the base substrate and configured to include a channel, the semiconductor substrate further comprising at least one isolation region defining an active area along a surface of the semiconductor substrate;
 first and second ohmic contacts supported by the semiconductor substrate in the active area and in ohmic contact with the channel for current flow through the channel;

a gate that includes a lateral overhang portion supported by the semiconductor substrate and between the ohmic contacts and in contact with a barrier layer, disposed over the channel to control the current flow through the channel;

first and second dielectric layers supported by the semiconductor substrate wherein the first and second ohmic contacts extend through ohmic openings and the gate extends through a gate opening in the first and second dielectric layers wherein the first and second dielectric layers abut the gate along a vertical stem of the gate, and a gate overhang gap separates the lateral overhang portion of the gate from the first dielectric layer, wherein the second dielectric layer contacts the first and second ohmic contacts, wherein a portion of an upper surface of the gate over the gate opening is recessed below at least a portion of the lateral overhang of the gate, and wherein the first dielectric layer directly contacts the second dielectric layer under the gate overhang gap;

wherein the second dielectric layer is disposed between the first dielectric layer and the surface of the semiconductor substrate; and wherein the second dielectric layer comprises a wet etchable material having an etch selectivity to a dry etchant of the first dielectric layer.

10. The HFET device of claim 9, further comprising a buffer/channel layer disposed over the base substrate and underneath the channel.

11. The HFET device of claim 10, wherein a channel portion comprises a near-channel back-barrier region disposed over a buffer portion of the buffer/channel layer and underneath a channel region of the channel portion.

12. The HFET device of claim 11, wherein the near-channel back-barrier region comprises indium gallium nitride.

13. A method of fabricating a semiconductor device, the method comprising:
defining an active area of the semiconductor device along a surface of a semiconductor substrate;
depositing an etch stop dielectric layer on the surface in the active area;
depositing a passivation layer on the etch stop dielectric layer;
defining an ohmic contact area by dry etching the passivation layer;
removing the etch stop dielectric layer in the ohmic contact area via a wet etch; and
forming an ohmic contact in the ohmic contact area, wherein the ohmic contact is in contact with the etch stop layer;
forming a gate opening;
forming a gate over the gate opening that includes a lateral overhang portion adjacent to the ohmic contact,
wherein forming the gate comprises forming the lateral overhang of the gate that is separated from the passivation layer by a gate overhang gap, wherein a portion an upper surface of the gate over the gate opening is recessed below at least a portion of the lateral overhang portion of the gate, and wherein the etch stop dielectric layer directly contacts the passivation layer under the gate overhang gap.

14. The method of claim 13, further comprising patterning the etch stop dielectric layer to expose a portion of the active area such that depositing the passivation layer comprises depositing the passivation layer on the surface in the portion of the active area.

15. The method of claim 13, wherein the semiconductor substrate includes a base substrate and first and second Group III-nitride semiconductor layers epitaxially grown on the base substrate, wherein the first Group III-nitride semiconductor layer is configured to include the channel.

16. The method of claim 15, wherein the LPCVD temperature is between about 600° C. and about 750° C.

17. The method of claim 13, wherein depositing the etch stop dielectric layer is implemented in situ with growing the first and second epitaxial Group III-nitride semiconductor layers.

18. The method of claim 13, wherein the etch stop dielectric layer comprises Aluminum oxide.

19. The method of claim 13, wherein depositing the passivation layer comprises implementing a low pressure chemical vapor deposition (LPCVD) at an LPCVD temperature below the crystallization temperature of the etch stop dielectric layer.

20. The method of claim 13, further comprising:
defining a gate area by dry etching the passivation layer; and
removing the etch stop dielectric layer in the gate area via the wet etch.

* * * * *